(12) United States Patent
Majima et al.

(10) Patent No.: US 9,240,561 B2
(45) Date of Patent: Jan. 19, 2016

(54) NANODEVICE AND METHOD FOR FABRICATING THE SAME

(71) Applicant: JAPAN SCIENCE AND TECHNOLOGY AGENCY, Kawaguchi-shi, Saitama (JP)

(72) Inventors: Yutaka Majima, Yokohama (JP); Toshiharu Teranishi, Uji (JP); Kazuhiko Matsumoto, Ibaraki (JP); Kenzo Maehashi, Ibaraki (JP); Yasuo Azuma, Yokohama (JP); Yasuhide Ohno, Ibaraki (JP); Kosuke Maeda, Yokohama (JP); Guillaume Hackenberger, Yokohama (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 0 days.

(21) Appl. No.: 14/381,868

(22) PCT Filed: Feb. 27, 2013

(86) PCT No.: PCT/JP2013/055261
§ 371 (c)(1),
(2) Date: Aug. 28, 2014

(87) PCT Pub. No.: WO2013/129535
PCT Pub. Date: Sep. 6, 2013

(65) Prior Publication Data
US 2015/0014624 A1    Jan. 15, 2015

(30) Foreign Application Priority Data

Feb. 28, 2012   (JP) ................................ 2012-042588

(51) Int. Cl.
*H01L 51/05*    (2006.01)
*H01L 27/088*   (2006.01)
(Continued)

(52) U.S. Cl.
CPC ............. *H01L 51/0512* (2013.01); *B82Y 10/00* (2013.10); *H01L 21/8221* (2013.01); *H01L 27/04* (2013.01); *H01L 27/0611* (2013.01);
(Continued)

(58) Field of Classification Search
CPC ............. H01L 29/7613; H01L 49/006; H01L 29/66439; H01L 27/0688; H01L 21/8221; H01L 27/0611; H01L 27/088; H01L 51/102; Y10S 977/773; Y10S 438/962; B82Y 10/00
See application file for complete search history.

(56) References Cited

U.S. PATENT DOCUMENTS

2005/0230713 A1* 10/2005 Brousseau, III ......... B82Y 5/00
                                                                 257/213
2008/0108227 A1*  5/2008 Kumagai ............... B82Y 10/00
                                                                 438/765

(Continued)

*Primary Examiner* — Jae Lee
*Assistant Examiner* — Mohammed R Alam
(74) *Attorney, Agent, or Firm* — Westerman, Hattori, Daniels & Adrian, LLP

(57) ABSTRACT

This invention is to provide a nanodevice, which is combined with an electronic device such as a diode, tunnel device and MOS transistor, integrated circuit and manufacturing method of the nanodevice. A nanodevice includes: a first insulating layer 2; one electrode 5A and the other electrode 5B provided to have a nanogap on the first insulating layer 2; a metal nanoparticle or a functional molecule provided between the one electrode 5A and the other electrode 5B; a second insulating layer 8 provided on the first insulating layer 2, and on the one electrode 5A and the other electrode 5B to embed the metal nanoparticle or the functional molecule. The second insulating layer works as a passivating layer.

10 Claims, 27 Drawing Sheets

(51) Int. Cl.
*H01L 27/06* (2006.01)
*B82Y 10/00* (2011.01)
*H01L 27/04* (2006.01)
*H01L 29/66* (2006.01)
*H01L 21/822* (2006.01)
*H01L 49/00* (2006.01)
*H01L 51/10* (2006.01)

(52) U.S. Cl.
CPC .......... *H01L 27/0688* (2013.01); *H01L 27/088* (2013.01); *H01L 29/66477* (2013.01); *H01L 49/006* (2013.01); *H01L 51/102* (2013.01); *H01L 2251/10* (2013.01)

(56) References Cited

U.S. PATENT DOCUMENTS

| 2008/0149921 | A1* | 6/2008 | Choi | B82Y 20/00 257/40 |
| 2008/0191202 | A1* | 8/2008 | Hobara | B82Y 10/00 257/40 |
| 2010/0214034 | A1* | 8/2010 | Peng | B82Y 10/00 331/154 |
| 2012/0009749 | A1* | 1/2012 | Tan | B82Y 10/00 438/284 |

* cited by examiner (A)

(B)

(A)

(B)

(A)

(B)

NANODEVICE AND METHOD FOR FABRICATING THE SAME

TECHNICAL FIELD

The present invention relates to a nanodevice, which is combined with an electronic device such as a diode, tunnel device and MOS transistor, its integrated circuit and a manufacturing method of the nanodevice.

BACKGROUND ART

Single electron transistor is one of nanodevices. To establish manufacturing technology for the single electron transistor, focusing on a gold nanoparticle as Coulomb island in single-electron device, the inventors used STM and clarified that the gold nanoparticle with particle diameter of 1.8 nm functioned as Coulomb island at ambient temperature. In addition, aiming to construct an electronic device on solid substrate, the inventors used electroless plating and established the method for manufacturing nanogap electrodes with a gap separation of 5 nm at a high yield rate at a time. Furthermore, the inventors reported on function of the single electron transistor, in which the gold nanoparticle was placed between the nanogap electrodes by chemical adsorption (Non-Patent Literatures 1 to 5).

CITATION LIST

Non-Patent Literature

Non-patent literature 1: S. Kano, Y. Azuma, M. Kanehara, T. Teranishi, Y. Majima, Appl. Phys. Express, 3, 105003 (2010)
Non-patent literature 2: Y. Yasutake, K. Kono, M. Kanehara, T. Teranishi, M. R. Buitelaar, C. G. Smith, Y. Majima, Appl. Phys. Lett., 91, 203107 (2007)
Non-patent literature 3: Victor M. Serdio V., Yasuo Azuma, Shuhei Takeshita, Taro Muraki, Toshiharu Teranishi and Yutaka Majima, Nanoscale, 4, 7161 (2012)
Non-patent literature 4: N. Okabayashi, K. Maeda, T. Muraki, D. Tanaka, M. Sakamoto, T. Teranishi, Y. Majima, Appl. Phys. Lett., 100, 033101 (2012)
Non-patent literature 5: Hiroshi Igawa, Satoshi Fujiwara, Yasuo Takahashi, Technical Report of IEICE, ED2001-241, SDM2001-250, Page 15 to 20,
Non-patent literature 6: See Kei Lee, Ryo Yamada, Shoji Tanaka, Gap Soo Chang, Yoshihiro Asai, and Hirokazu Tada, ACS Nano, 6, 5078 (2012)

SUMMARY OF INVENTION

Technical Problem

The single electron transistor fabricated in this method includes the nanogap electrodes with a gap separation of 5 nm or less and a nanoparticle having organic molecules as ligand, and could not be integrated while only its prototypes were fabricated.

In consideration of the above problem, the present invention aims to provide a nanodevice, which is combined with an electronic device such as a diode, tunnel device and MOS transistor, its integrated circuit and manufacturing method of the nanodevice.

Solution to Problem

In order to achieve an object, a nanodevice of the present invention includes a first insulating layer; one and the other electrodes provided to have a nanogap on the first insulating layer; a metal nanoparticle or a functional molecule provided between the one and the other electrodes; a second insulating layer provided on the first insulating layer, and on the one and the other electrodes to embed the metal nanoparticle or the functional molecule.

In the above structure, one or more gate electrodes are provided on the first insulating layer in the direction crossing the direction in which the one and the other electrodes are provided, and the gate electrode(s) is covered with the second insulating layer.

In the above structure, a gate electrode to apply voltage to the metal nanoparticle is provided on the second insulating layer.

In the above structure, the second insulating layer is composed of any one of SiN, SiO, SiON, $Si_2O_3$, $Si_3N_4$, $SiO_2$, $Al_2O_3$, and MgO.

In the above structure, insulating films are interposed between the one electrode and the metal nanoparticle and between the other electrode and the metal nanoparticle, and the insulating film is composed of inorganic or organic material.

An integrated circuit of the present invention is composed of the nanodevice and an electronic device, which is formed on a semiconductor substrate. For example, the integrated circuit includes: a first insulating layer provided above a semiconductor substrate on which an electric device is formed; one and the other electrodes provided to have a nanogap on the first insulating layer; a metal nanoparticle or a functional molecule provided between the one and the other electrodes; and a second insulating layer provided on the first insulating layer, and on the one and the other electrodes to embed the metal nanoparticle or the functional molecule, wherein one of electrodes of the electronic device is connected to the one electrode with a via provided through the first insulating layer.

A method for fabricating a nanodevice of the present invention includes: providing a metal nanoparticle or a functional molecule above a substrate with an insulating layer on which one and the other electrodes having a nanogap are provided; and forming a passivation film on the one and the other electrodes and the substrate with the insulating layer, whereby the metal nanoparticle or the functional molecule are embedded.

Especially, the substrate with the insulating layer is cooled when a passivation film is formed.

Especially, the passivation film is formed using any one of methods: catalytic CVD, plasma CVD, photo CVD, pulsed laser deposition, atomic layer epitaxy, and thermal CVD.

Effect of Invention

In the present invention, a nanoparticle or a functional molecule is placed as ligand between the nanogap electrodes, and since another insulating layer covers them, this insulating layer functions as a passivation layer. Therefore, a gate electrode can be placed on the passivation layer and above the metal nanoparticle or the function molecule, and nanodevice can be integrated. In addition, another insulating layer can be placed on the gate electrode and via holes can be opened as needed to construct electrodes for wiring and to integrate the nanodevice.

In addition, for the nanogap electrode, a seed electrode can be installed on the substrate by using the lithography technology and surface acting agent can be mixed with the electroless agent to control the nanogap separation in manufacturing. Therefore, a diode, tunnel device and MOS transistor can be fabricated almost at the same time when the nanogap electrodes are fabricated. Therefore, the device can be integrated three-dimensionally.

BRIEF DESCRIPTION OF DRAWINGS

FIG. 1 (A) is a cross-sectional view and (B) is a plan view.

FIG. 2 (A) is a cross-sectional view and (B) is a plan view.

REFERENCE SIGNS LIST

Figure 1:
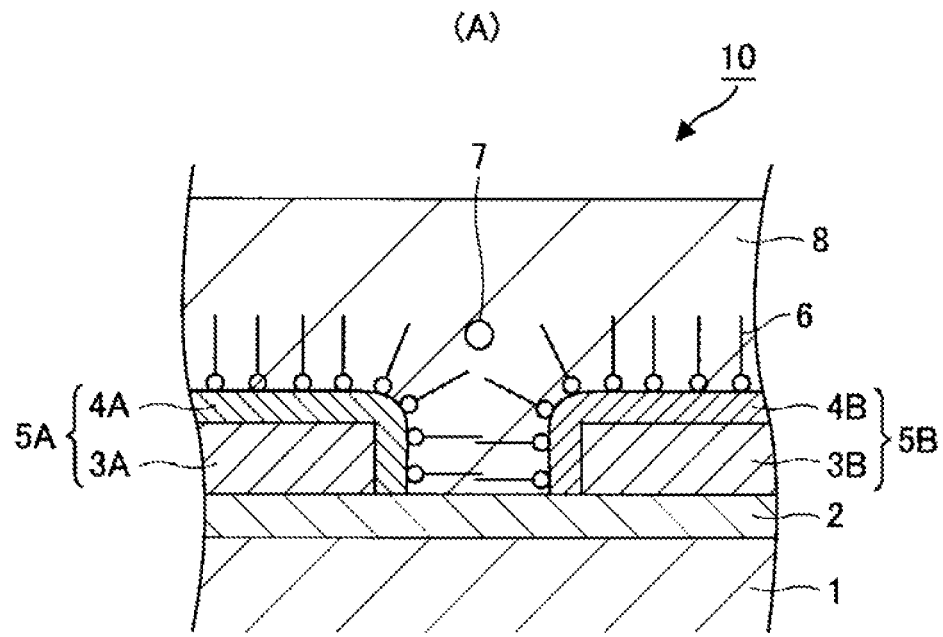
FIG. 1 schematically shows a single-electron element as a nanodevice according to the first embodiment of the present invention.
Figure 1:
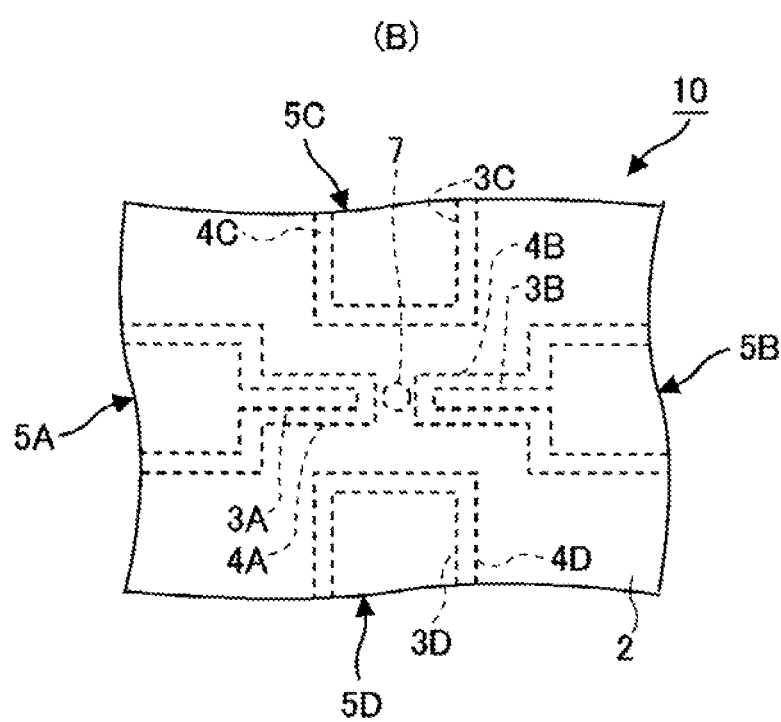

1: Substrate
2: First insulating layer
3A, 3B, 4A, 4B: Metal layer
5A: Nanogap electrode (one electrode)
5B: Nanogap electrode (the other electrode)
5C, 5D: Gate electrode (side gate electrode)
6, 6A, 6B Self-assembled monolayer
7: Metal nanoparticle
8: Second insulating layer
9: Mixed self-assembled monolayer layer (mixed SAM layer)
9A: Alkanethiol
10, 20: Single-electron element
21: Gate electrode (top gate)
30, 60: Integrated circuit
40, 62: MOSFET
50, 61: Single-electron element
31: Substrate
41: Source
42: Drain
43: First insulating layer
43A: Bottom portion of first insulating layer
43B: Top portion of first insulating layer
44: Gate electrode 45, 46, 48, 49: Via
51: Source electrode
52: Drain electrode
53: Metal nanoparticle
54: Second insulating layer
55: Gate electrode
70, 80: Nanodevice
71: Insulating film
81: Functional molecule

DESCRIPTION OF EMBODIMENTS

The embodiments of the present invention will hereinafter be described by referring to the drawings.

Before describing the embodiments of the present invention, description will be made about the reasons why laying of passivation layer, which was performed in manufacturing of existing DRAMs, could not be performed for manufacturing of nanodevices such as single electron device.

When forming an inorganic insulating layer such as SiN by using the catalytic CVD, plasma CVD, photo CVD or PLD, generally, samples may be exposed in plasma, or be spattered with particles with high kinetic energy and the substrate temperature became high mainly to improve the layer quality. Single electron devices were easily destroyed by plasma, high energy particles, heat, etc. applied to these substrates. So it was difficult to deposit inorganic insulating layer.

Namely, when an inorganic insulating layer is deposited on the nanoparticle, the surface of which is covered by an organic substance such as self-assembled monolayer (SAM), or on the nanoparticle, the surface of which is covered by ligand molecule, the layer source destroys the SAM and the ligand molecule, and the nanoparticle is destroyed and so the element is destroyed. Even if the element is not destroyed, the nanoparticle existing in the gap moves into the deposited inorganic insulator and then the element cannot function as a single electron element. Especially the metal electrode of the nanoscale used as a metal nanogap electrode has high fluidity when heat is applied, and so the nanogap structure changes and the single electron element is destroyed when heat is applied.

However, researching intensively and focusing on the following viewpoints, the inventors completed the present invention.
1) An electrode couple can be formed while controlling the gap separation by using electroless plating, and the nanogap is stable against heat.
2) When depositing inorganic insulator, the electrode surface is not destroyed because the metal nanoparticle is covered by the coordinated molecule and the nanogap electrode is covered by the SAM.
3) The metal nanoparticles, which function as a single electron island (also called Coulomb island), are fixed chemically within the nanogap by anchor molecule, for example, dithiol molecule.

In the present invention, not only in the case of single electron element, a functional molecule such as fullerene, instead of the metal nanoparticle, can be placed in the nanogap between one electrode and other electrode. This is because the electrode couple can be formed while the gap separation is controlled by electroless plating, such a nanogap electrode is stable against heat and the functional molecule such as fullerene, which functions as a Coulomb island, is chemically fixed within the nanogap by the anchor molecule. At that time, if the functional molecule is directly synthesized so that the functional molecule contains the anchor section, which contacts the electrode ohmically, it is effective from the viewpoint of reducing the element resistance. There are a total of two conduction paths between the functional molecule and the electrode couple, namely one is between one electrode and the functional molecule and the other is between another electrode and the functional molecule. Of these two conduction paths, it is preferred that the functional molecule contact the electrode ohmically in one or both conduction paths. If there is a Schottky barrier or a tunnel barrier, the resistance becomes larger and voltage sharing occurs.

Out of the functional molecule, in some cases there may be tunnel resistance between the part showing electrical conductivity and the electrode interface. For example, if fullerene is inserted directly into the nanogap as a functional molecule, there exists a tunnel barrier. If the functional molecule (Non-Patent Literature 6), which has the functional group as shown in Chemical Formula 1, is used, ohmic contact can be performed and the functional molecule function can be expressed more easily. Then if an oligothiophene molecule (m is a natural number) is placed between the two functional groups in Chemical Formula 1, conductive molecular wire is formed. The functional molecule can be so structured that the functional group, which is contacted ohmically, exists only on one side, and ohmic contact is not performed on the other side. In this case, since electric charge enters and leaves the functional molecule easily on the ohmic contact side and the electric charge to the electrode is applied on the other conduction path without any change, the electric field can be easily applied to the functional molecule and the function can be expressed easily.

[Chemical Formula 1]

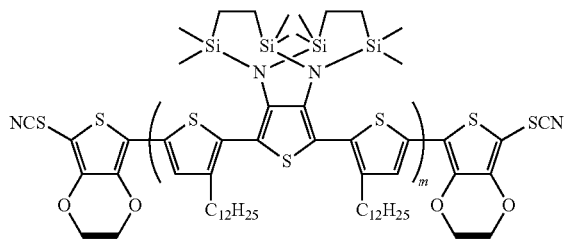

As explained above, when expressing the function by using the electron level of molecule and changing the valence, it is preferred to keep the conduction path resistance on the one side low, namely to have ohmic contact as shown above. To synthesize the functional molecule directly so that the functional molecule contains the part, which becomes the anchor to the electrode, for example, there is the π-conjugated system for the anchor part as shown in Chemical Formula 1 and it is preferred for ohmic contact to have the structure where the wave function for the π-conjugated system overlaps that for the electrode metal surface. The overlapping of wave functions for the π-conjugated system for the anchor part as shown in Chemical Form 1 and the π-conjugated system for the molecule function part decides the electrical conductivity of the functional molecule. If the π-conjugated system is placed on the flat surface where the wave functions overlap largely, the electrical conductivity within the molecule becomes high. Incidentally, the above molecule is designed to be a flat structure. On the other hand, if the flatness of the π-conjugated system is disturbed, the electrical conductivity within the molecule including the function site becomes low.

Embodiment 1

FIG. 1 (A) is the typical section view of single electron element for Embodiment 1 of the present invention, and (B)

shows the plain view of the single electron element. The single electron element 10 as a nanodevice for Embodiment 1 comprises the substrate 1, first insulating layer 2 provided on the substrate 1, one electrode 5A and other electrode 5B provided so as to comprise a nanogap separation on the first insulating layer 2, self-assembled monolayer 6 as an insulating layer set on the one electrode 5A and the other electrode 5B, metal nanoparticle 7 adsorbed on the self-assembled monolayer 6 and placed between the one electrode 5A and the other electrode 5B, first insulating layer 2 and second insulating layer 8 that is provided on the one electrode 5A and the other electrode 5B and buries the self-assembled monolayer 6 and the metal nanoparticle 7.

The nanogap separation is several nm, for example, 2 nm to 12 nm. Around the metal nanoparticle 7, the self-assembled mixed monolayer formed by reaction between the self-assembled monolayer and the organic molecule is adsorbed and provided as an insulating layer. In Embodiment 1, on the first insulating layer 2, gate electrodes 5C and 5D (they can be called side-gate electrodes) are provided in the direction that crosses the array direction of the one electrode 5A and the other electrode 5B, specifically in the perpendicular direction.

Various semiconductor substrates such as a Si substrate are used for the substrate 1. The first insulating layer 2 is formed by $SiO_2$, $Si_3N_4$, etc.

The one electrode 5A and the other electrode 5B are formed by Au, Al, Ag, Cu, etc. The one metal 5A and the other metal 5B can be also formed by laying the adhesion layer and the metal layer one by one. The adhesion layer is formed by Ti, Cr, Ni, etc. and the metal layer is formed on the adhesion layer by different metals such as Au, Al, Ag and Cu.

Various types of the self-assembled monolayer 6 are used. The self-assembled monolayer 6 comprises the first functional group, which is chemically adsorbed to the metal atoms constructing the first electrode 5A, and the second electrode 5B, which is bonded to the first functional group. The first functional group is any one of thiol group, dithiocarbamate group and xanthate group. The second functional group is any one of alkane, alkene, alkane or alkene whose part or whole of hydrogen molecule is replaced by fluorine, amino group, nitro group and amido group.

The metal nanoparticle 7 is a particle with diameter of several nm, and gold, silver, cupper, nickel, iron, cobalt, ruthenium, rhodium, palladium, iridium, platinum, etc. are used for this nanoparticle. Around the metal nanoparticle 7, molecules such as alkanethiol that bond with the straight chain of molecules that construct the self-assembled monolayer 6 are bonded.

The second insulating layer 6 is formed by inorganic insulator such as SiN, SiO, SiON, $Si_2O_3$, $SiO_2$, $Si_3N_4$, $Al_2O_3$ and MgO. For the inorganic insulator, it is preferable to use one of stoichiometric composition, but an inorganic insulator that has the composition similar to the stoichiometric one can be used.

Detailed explanation is made about the manufacturing method for the single electron element 10 as the nanodevice shown in FIG. 1. First of all, the first insulating layer 2 is formed on the substrate 1. Subsequently, the nanogap electrodes 5A and 5B and the side-gate electrodes 5C and 5D are formed by molecular-ruler electroless plating.

For example, the metal layers 3A and 3B are placed separated in a pair on the first insulating layer 2 so that the gap between these two is wider than the nanogap, and then the substrate 1 is immersed into electroless plating solution. The electroless plating solution is produced by mixing reducing agent and surface acting agent with electrolytic solution that contains metallic ions. When the substrate 1 is immersed into the electroless plating solution, metallic ions are reduced by the reducing agent, metal is deposited on the surface of the metal layers 3A and 3B, forming the metal layers 4A and 4B and narrowing the gap between the metal layer 4A and the metal layer 4B, and the surface acting agent contained in the electroless plating solution is chemically adsorbed to the metal layers 4A and 4B formed by deposition. The surface acting agent controls the gap separation (simply called "gap separation") in nanometer size. This method is classified as electroless plating because the metal ions in the electrolytic solution are reduced by the reducing agent and the metal is deposited. The metal layers 4A and 4B are formed on the metal layers 3A and 3B by plating, producing a pair of the electrodes 5A and 5B. Thus, using the electroless plating (hereafter referred to as "molecular-ruler electroless plating") that uses the surface acting agent molecules, which are the protecting group, as the molecular ruler for the surface of the nanogap electrodes 5A and 5B, the gap separation is controlled by the molecules of the surface acting agent. Accordingly, the nanogap electrodes 5A and 5B can be formed in high accuracy. The gate electrodes 5C and 5D can also be formed at the same time.

Subsequently, ligand exchange of the gold nanoparticle 7 protected by alkanethiol by dithiol molecule is used to chemically bond the metal nanoparticle 7 between the nanogap electrodes 5A and 5B. Thus, the metal nanoparticle 7 is fixed on, for example, the self-assembled monolayer 6.

Figure 2:
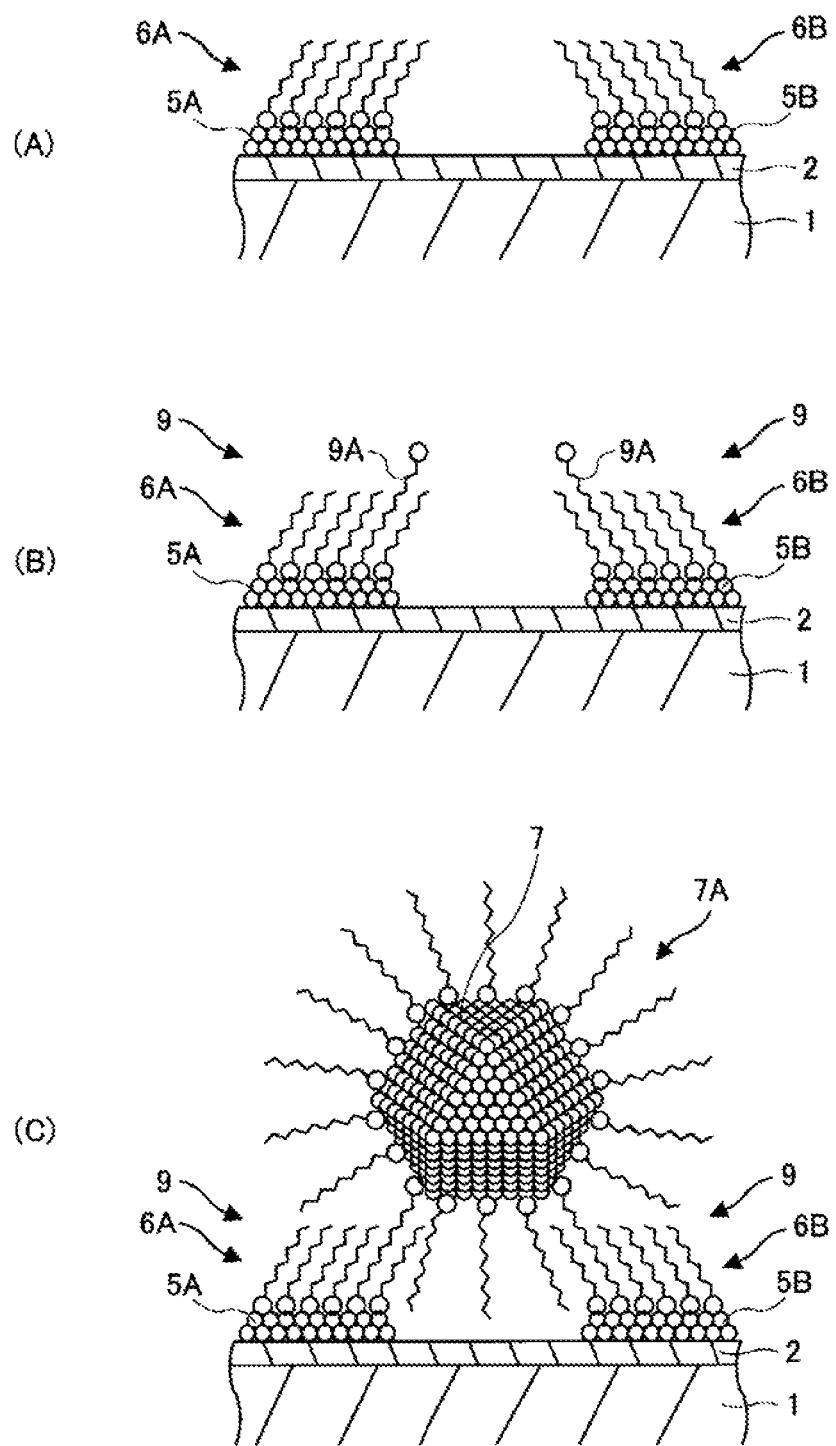
FIGS. 2 (A) to (C) are views schematically showing installation process of single electron island for the electrodes, which has the nanogap separation, in chemical bonding by using, for example, dithiol molecules.

FIG. 2 shows the typical installation process of single electron island for the electrode 5A and 5B, which has the nanogap separation, in chemical bonding by using, for example, dithiol molecules. As shown in FIG. 2 (A), self-assembled monolayers (SAMs) 5A and 5B are formed on the surface of metal electrodes 5A and 5B. Subsequently, as shown in FIG. 2 (B), alkanedithiol 9A is introduced to place alkanedithiol on the defective SAM part or exchange is performed between alkanethiol and alkanedithiol, and so the mixed SAM layer 9 is formed as an insulating layer that comprises SAM and alkanethiol. Subsequently, the metal nanoparticle 7A protected by alkanethiol is introduced. Then, as shown in FIG. 2 (C), the metal nanoparticle 7 is chemically adsorbed to the self-assembled monolayer by ligand exchange between the alkanethiol, which is the protecting group of the metal nanoparticle 7, and the alkanedithiol contained in the mixed self-assembled monolayers 6A and 6B, which comprise alkanethiol and alkanedithiol.

Thus, using the self-assembled monolayers 6A and 6B and placing the mixed SAM layer 9 as an insulating layer in between, the metal nanoparticle 7 is installed as a single electron island between the electrodes 5A and 5B, which have the nanogap separation, by chemical adsorption.

Subsequently, by using the catalytic CVD, plasma CVD, photo CVD or pulsed laser deposition (PLD), the second insulating layer 8 is deposited on the sample while cooling the substrate with the nanogap electrodes, in which the metal nanoparticle 7 is chemically adsorbed by the self-assembled monolayers 6A and 6B, so that sample is not heated above the specified temperature.

In addition, when depositing $Al_2O_3$ or $Si_3N_4$, as the second insulating layer 8, atomic layer epitaxy or thermal CVD can be used to pyrolyze gas. In that case, it is necessary to sufficiently cool the sample base.

Subsequently, for external connection of the nanogap electrodes 5A and 5B, the electrodes for external extraction are formed. For example, by forming a resist on the second insulating layer 8, placing a mask on the resist and exposing it to light, a mask patter is formed on the resist. Then, a via hole is formed on the second insulating layer 8. Self-assembled monolayer in the via-hole is removed by ashing as needed. Metal is filled in the via hole to form an electrode for external extraction.

As shown above, the single electron element 10 can be produced as a nanodevice for Embodiment 1.

Embodiment 2

Figure 3:
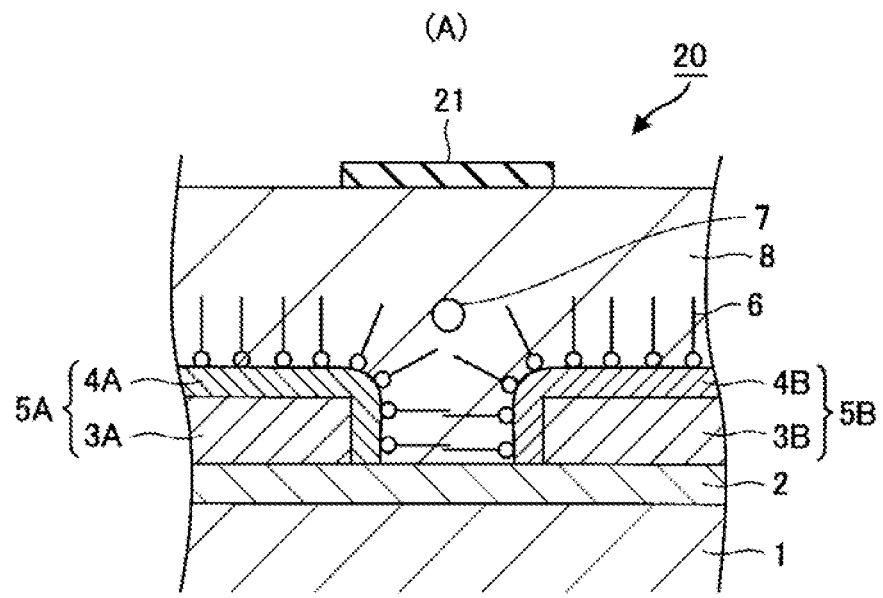
FIG. 3 schematically shows a single-electron element as a nanodevice according to the second embodiment of the present invention.
Figure 3:
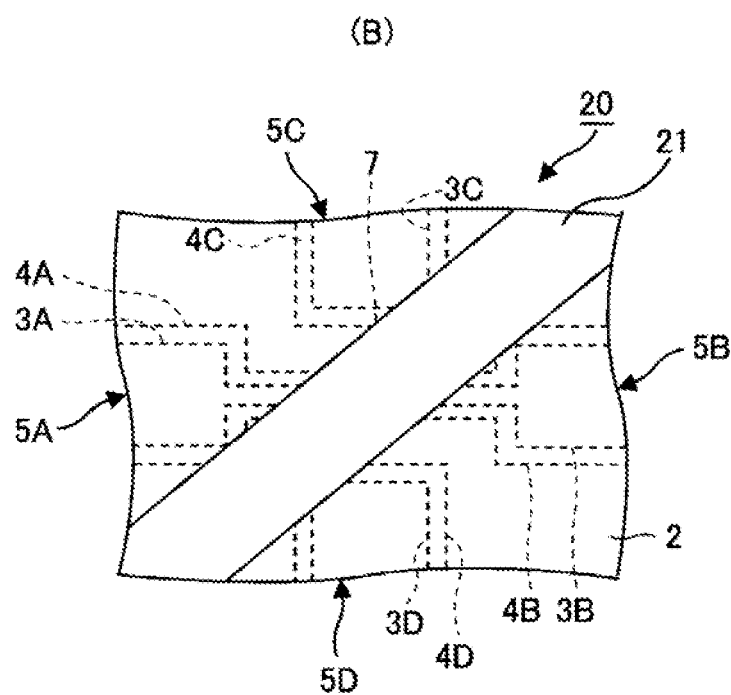

Explanation is made about the single electron element 20 as a nanodevice for Embodiment 2. FIG. 3 (A) is the typical section view of the single electron element 20 as a nanodevice for Embodiment 2, and (B) shows the plain view of the single electron element as a nanodevice.

The single electron element 20 as a nanodevice for Embodiment 2 comprises the substrate 1, first insulating layer 2 provided on the substrate 1, one electrode 5A and other electrode 5B provided so as to comprise a nanogap separation on the first insulating layer 2, self-assembled monolayers 6 set on the one electrode 5A and the other electrode 5B, metal nanoparticle 7 adsorbed on the self-assembled monolayer 6 and placed between the one electrode 5A and the other electrode 5B, first insulating layer 2, second insulating layer 8 that is provided on the one electrode 5A and the other electrode 5B and buries the self-assembled monolayer 6 and the metal nanoparticle 7, and the gate electrode 21 that is provided on the second insulating layer 8 and just above the metal nanoparticle 7 as if bridging the one electrode 5A and the other electrode 5B.

In production of the single electron element 20 for Embodiment 2, after laying the second insulating layer 8 in the same procedure as for producing the single electron element 10 for Embodiment 1, resist is applied, the pattern is described on the gate electrode 21 by electron beam lithography or optical lithography and processed, and one or two types of metal layers are formed to produce the gate electrode 21. In this point, it is better to provide an adhesion layer.

In the above, gold is used for electrode material, but other metal can be used, not limited to gold. For example, copper can be used as electrode material for the initial electrode. At that time, for the initial electrode, copper electrode is formed by using electron beam lithography or optical lithography and then the copper electrode surface is made to be copper chloride. Subsequently, for plating solution, gold chloride solution that contains ascorbic acid as reducing agent is used to cover the copper electrode surface with gold. Specifically, aqueous solution of gold chloride (III) acid is mixed with surface acting agent of alkyl bromide trimethylammonium $C_nH_{2n+1}[CH_3]_3N^+.Br^-$, reducing agent L(+)-ascorbic acid is added, and autocatalytic electroless gold plating is performed on the gap electrode. Subsequently, using the molecular ruler plating method, nanogap electrodes, the surface of which is gold, are produced.

Embodiment 3

Next, explanation is made about the integrated circuit for Embodiment 3 for the present invention. For the integrated circuit, after forming electronic devices, for example, such as a diode, tunnel element and MOS transistor on the semiconductor substrate, single electron element is produced as a nanodevice for Embodiments 1 and 2.

Figure 4:
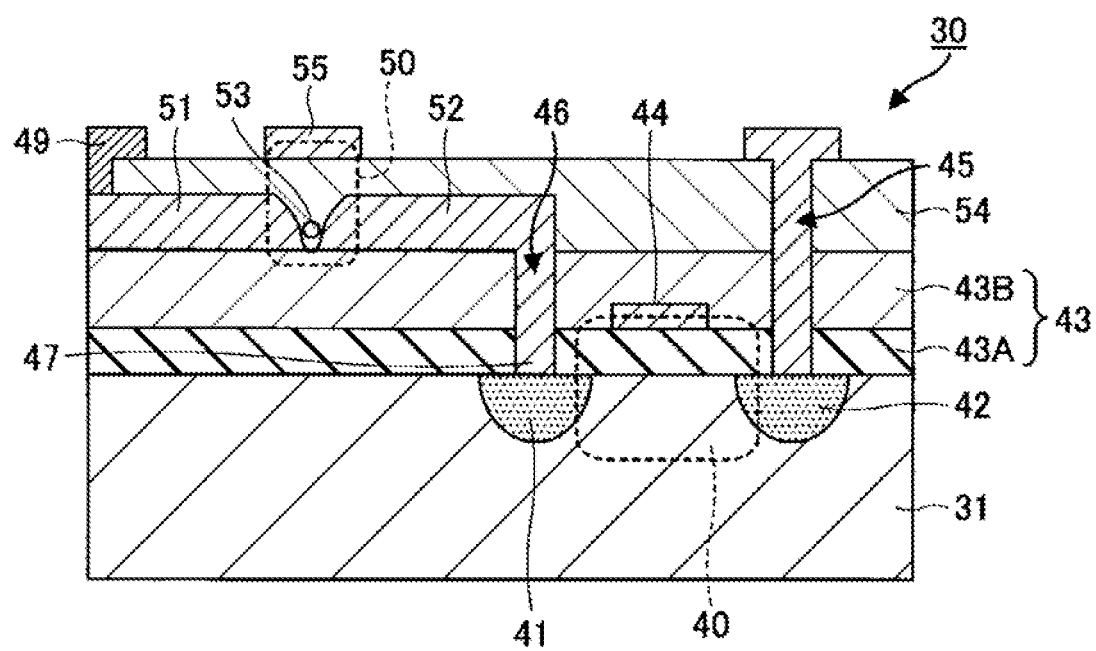
FIG. 4 is a cross-sectional view showing the integrated circuit according to the third embodiment of the present invention.
Figure 5:
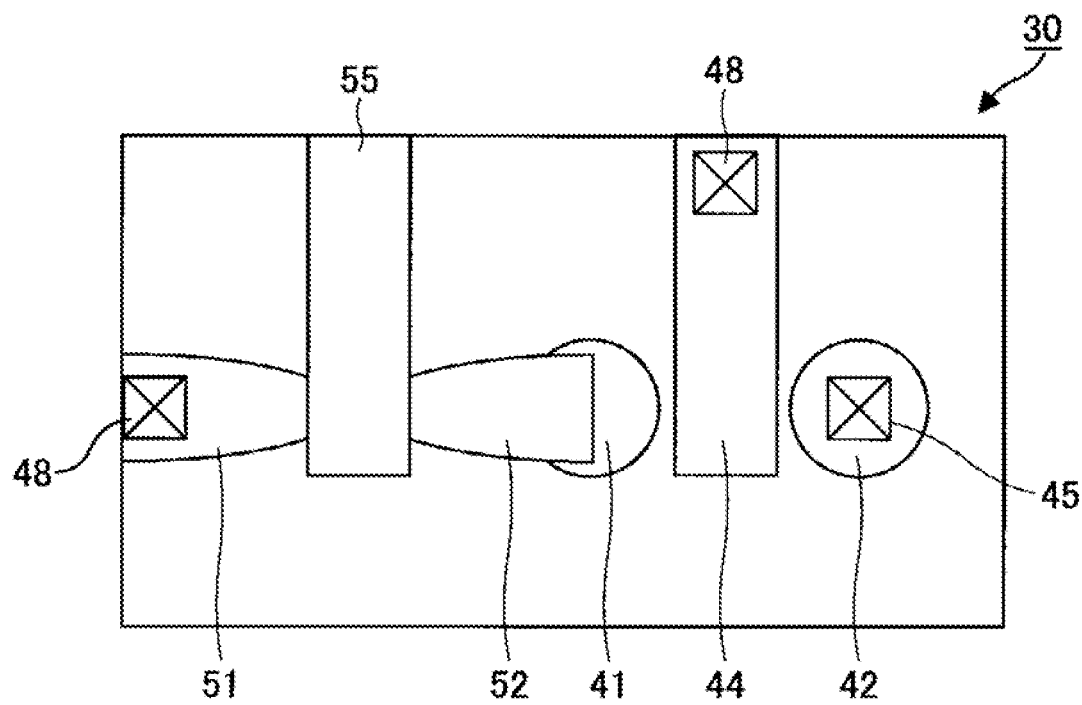
FIG. 5 is a plan view of the integrated circuit shown in FIG. 4.
Figure 6:
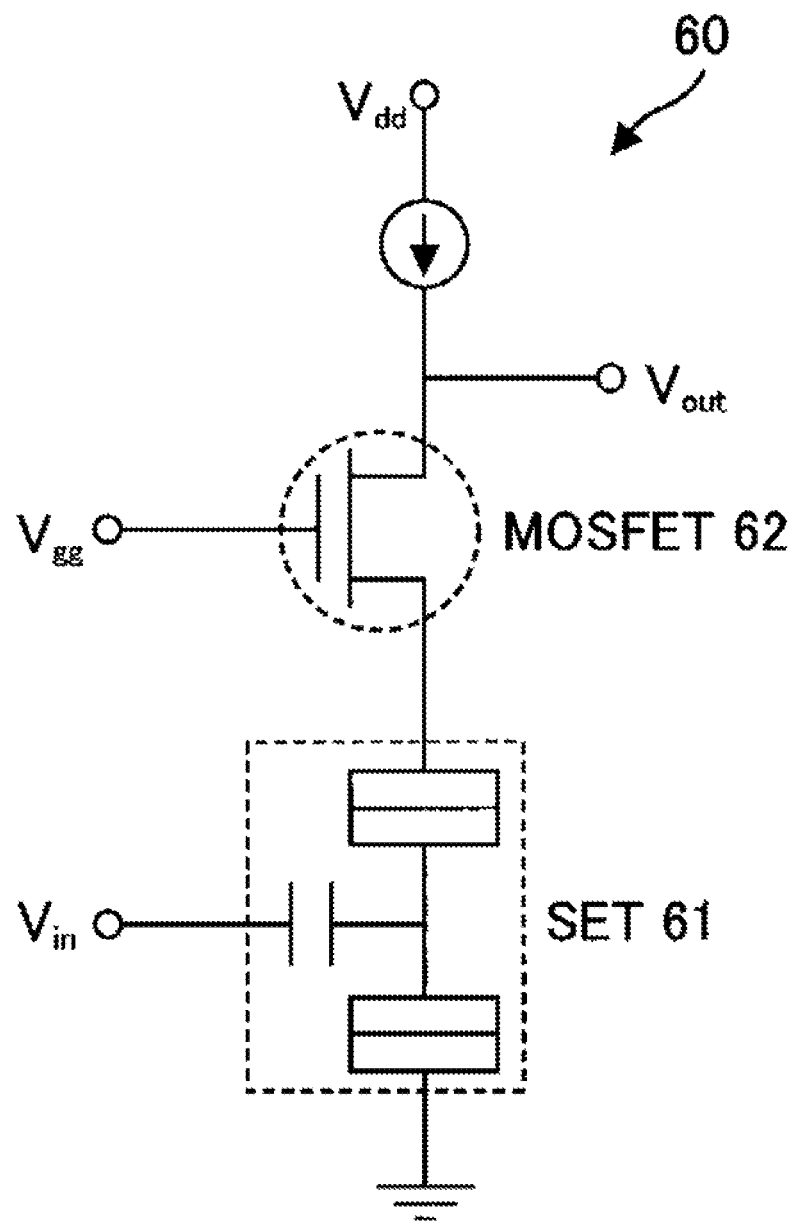
FIG. 6 is a circuit diagram of the integrated circuit shown in FIGS. 4 and 5.

FIG. 4 is a section view of the integrated circuit for Embodiment 3 of the present invention. FIG. 5 shows a plain view of the integrated circuit shown in FIG. 4. In the integrated circuit 30 shown in FIGS. 4 and 5, the MOSFET40 is provided on the Si substrate 31, and the single electron element 50 as a nanodevice is provided in the position where it does not overlaps the MOSFET40 in the planar view. FIG. 6 shows the circuit diagram of the integrated circuit 30 shown in FIGS. 4 and 5. The circuit 60 shown in FIG. 6 is the one called universal literal gate circuit where the single electron element 61 and the MOSFET62 are connected in series (see Non-Patent Literature 5).

On parts of the substrate 31, for example, p-type Si substrate, by partly diffusing impurities at an interval, the source 41 and the drain 42, which are reversely conducted with the substrate 31, can be provided. By setting a mask on the substrate 31 and diffusing impurities by heat diffusion or ion implantation, the source 41 and drain 42 can be formed.

The first insulating layer 43 is set on the source 41, drain 42 and substrate 31, and then the gate electrode 44 is set at a specified height from the substrate 31 within the first insulating layer 43. Out of the first insulating layer 43, after forming the lower part 43A of the first insulating layer 43, the gate electrode 44 of MOSFET40 is formed on the bottom portion 43A of the first insulating layer 43 by electron beam evaporation, etc. Subsequently, the upper first insulation layer 43B is formed on the gate electrode 44 and the bottom portion 43A of the first insulating layer 43. Then, the contact hole is provided penetrating through the upper part of the source 41 in the first insulating layer 43 and electrode material is filled to form the via 46. The lower end of the via 46 connected to the source 41 becomes the source electrode. At the same time, in the first insulating layer 43, a contact hole can be provided penetrating through the upper part of the drain 42, then electrode material can be filled and thus only the lower part of the via 45 can be formed.

Subsequently, the single electron element 50 described above for Embodiments 1 and 2 is provided on the first insulating layer 43. Namely, on the first insulating layer 43, the source electrode 51 and the drain electrode 52 are set so that a nanogap is provided, and the metal nanoparticle 53 is set as ligand on the source electrode 51 and the drain electrode 52 with a self-assembled monolayer, which is not shown in the FIGS. et in between. The method is already described. In this point, the upper end of the via 46 becomes an end of the drain electrode 52.

Thus, the second insulating layer 54 is provided on the first insulating layer 43, and on the source electrode 51 and the drain electrode 52 of the single electron element 50, and thus the second insulating layer 54 buries the self-assembled monolayer and the metal nanoparticle 53.

The gate electrode 55 of the single electron element 50 is set on the second insulating layer 54 and above the metal nanoparticle 53. In this point, the gate electrode 55 is set in the direction crossing the array direction of MOSFET40, the source electrode and the drain electrode of the single electron element 50, not parallel to them but perpendicular to them whenever possible. This is performed to reduce the parasitic electrostatic capacitance Thus, in the integrated circuit 30, the source 41 of MOSFET40 and the drain electrode 52 of single electron element 50 are connected with each other by the via 46 produced by filling the contact hole in the first insulating layer 43 with electrode material, and the lower end of the via 46 functions as the source electrode 47.

In the integrated circuit 30 for Embodiment 3 for the present invention, MOSFET40 and the single electron element 50 are connected in series. The respective gate electrodes are set separated in the vertical direction crossing the array direction of the source and the drain. The gate electrode 44 of MOSFET40 is wired by the via 48 formed by the contact hole filled with electrode material and formed on the upper first insulating layer 43B and on the second insulating layer 54, and can be extracted as wiring for external connection on the second insulating layer 54. The drain electrode of MOSFET40 is formed by the via 45, which is wired through the first and second insulating layers 43 and 54.

In addition, the source electrode 51 of the single electron element 50 is connected to the wiring on the second insulating layer 54 through the via 49. The drain electrode 52 of the single electron element 50 and the source electrode 47 of MOSFET40 are connected to each other by the via 46 provided in the first insulating layer 43.

As explained above, electronic devices such as MOSFET40 is formed on the substrate 31 of semiconductor, the electronic devices are covered by the first insulating layer 43, and the via 46 is formed in the first insulating layer 43. Subsequently, the single electron element 50 is formed on the first insulating layer 43 same as Embodiments 1 and 2, and one control electrode of the single electron element 50 is wired and connected to one control electrode of the electronic element 40 by the via 46. In the FIG., one control electrode of the single electron element 50 is a drain electrode and one control electrode of the electronic element 40 is a source electrode, but the configuration can be reversed. Other control electrodes of the single electron element 50 and other electrodes of the electronic element 40 can be wired and connected to the top of the second insulating layer 43 through the vias 45, 48 and 49 provided for the first and second insulating layers 43 and 54, respectively. Therefore, electrical signals of respective elements can be input and output.

In the nanodevices and the integrated circuit using them as explained above, for example, as shown as Embodiments 1 and 2, the explanation was made about the case where nanodevices are single electron elements and the mixed SAM layer 9, which consists of the self-assembled monolayer and alkanethiol, is provided between the metal nanoparticle 7 and the nanogap electrodes 5A and 5B, but the following embodiment is also available.

Embodiment 4

Figure 7:
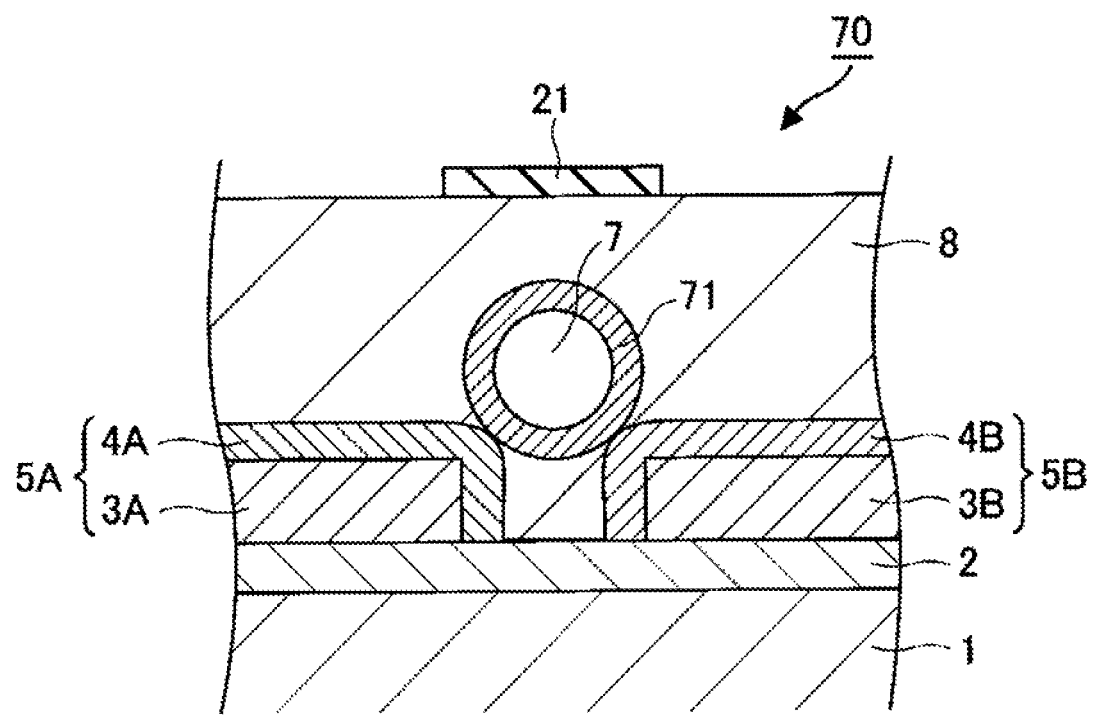
FIG. 7 is a cross-sectional view of the single electron element as a nanodevice according to the fourth embodiment of the present invention.

FIG. 7 shows a cross-sectional view of the single electron element as a nanodevice for Embodiment 4 of the present invention. In Embodiment 4, different from Embodiments 1 to 3, part or whole of the metal nanoparticle 7 of the nanodevice 70 is covered by the insulation film 71 of several to several tens nm. The nanogap electrode 5A is connected to the metal nanoparticle 7 through the insulating film 71 placed between them, and the metal nanoparticle 7 is connected to the nanogap electrode 5B through the insulating film 71 placed between them.

In this nanodevice 70, tunnel current flows between the nanogap electrode 5A and the nanogap electrode 5B by the thin insulating film 71 through the metal nanoparticle 7.

Embodiment 5

Figure 8:
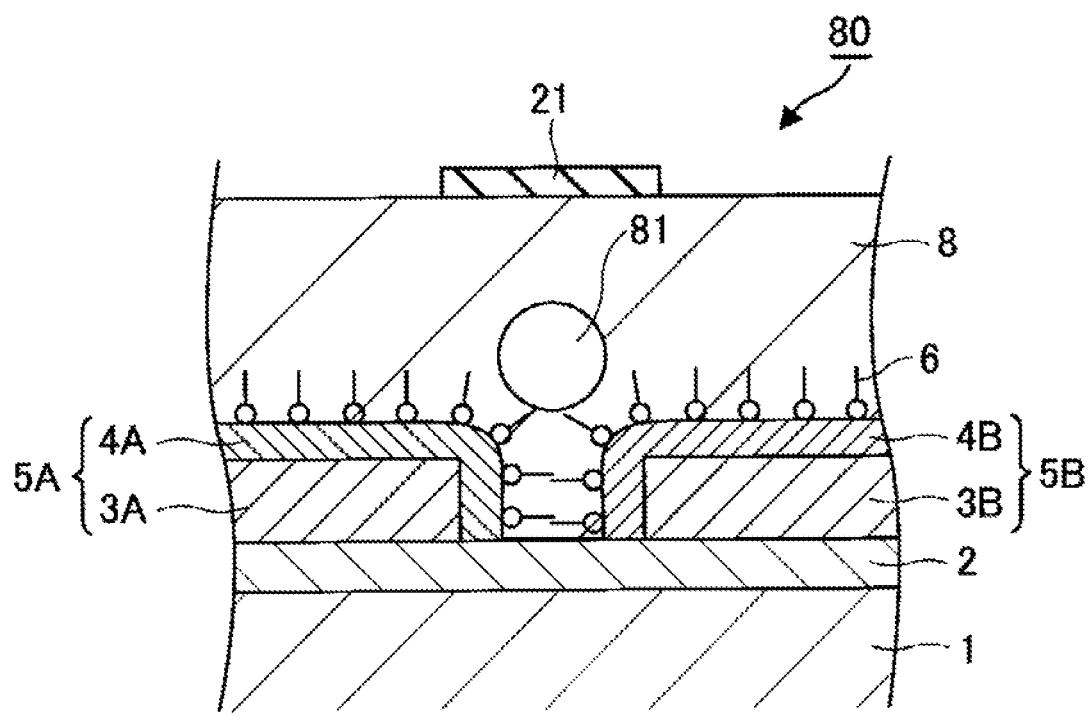
FIG. 8 is a cross-sectional view of the molecule element for the nanodevice according to the fifth embodiment of the present invention.

FIG. 8 shows a cross-sectional view of the molecule element for the nanodevice for Embodiment 5 of the present invention. In Embodiment 5, different from Embodiments 1 to 4, the function molecule 81 instead of the metal nanoparticle 7 is used for the nanodevice 80. Namely, the functional molecule 81 is placed between the nanogap electrode 5A and the nanogap electrode 5B. In this point, the nanogap electrodes 5A and 5B are insulated from the functional molecule 81. For the functional molecule 81, oligomer, a molecule that has π-conjugated system, can be used. A molecular element like this can be produced in the method similar to the one for the single electron element as already explained.

Example 1

Figure 9:
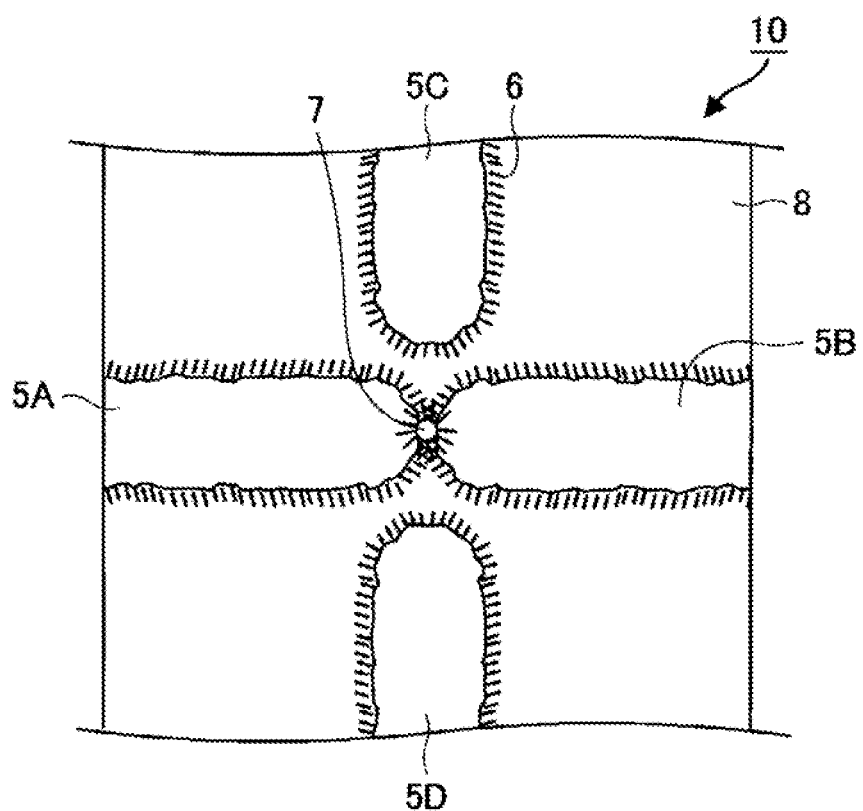
FIG. 9 is a plan view of the single electron transistor produced in Example 1.
Figure 10:
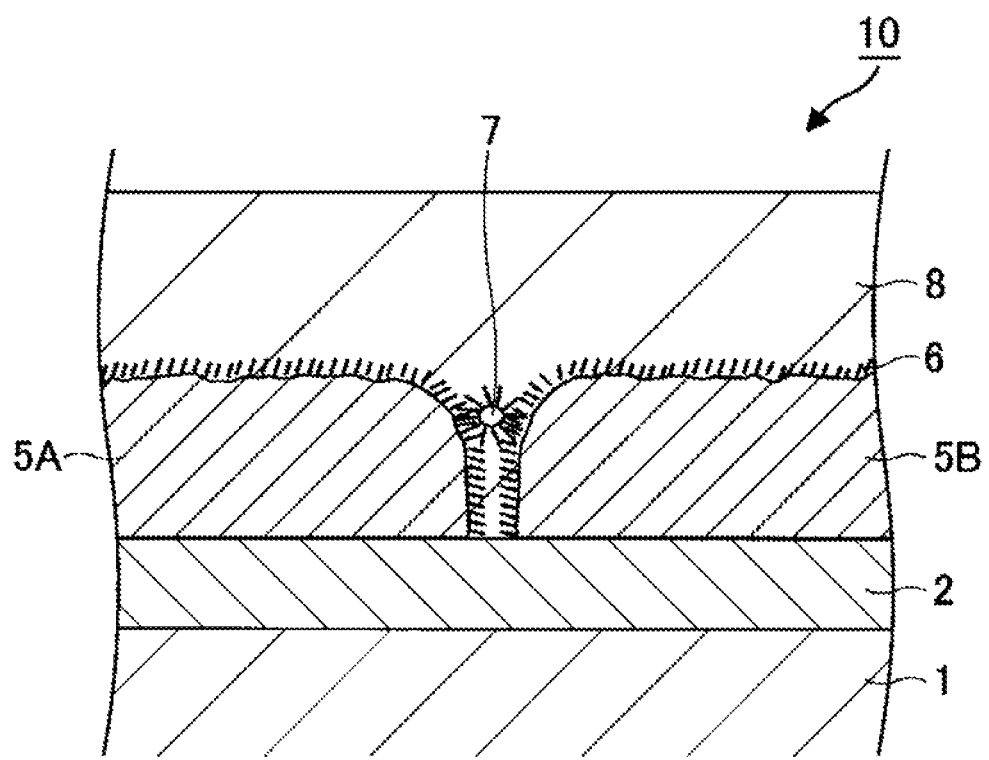
FIG. 10 is a cross-sectional view of the single electron transistor produced in Example 1.

FIG. 9 shows a plain view of the single electron transistor produced in Embodiment 1, and FIG. 10 shows its cross-sectional view. As Example 1, the single electron transistor was produced as the single electron element 10 for Embodiment 1 in the following procedure. The $SiO_2$ layer was formed as the first insulating layer 2 on the Si substrate 1 in the thermal CVD method, the metal nanogap electrodes 5A and 5B were formed on it, and the gold nanoparticle 7 was placed between the gold nanogap electrodes by using the mixed film of octanethiol and decanedithiol as the self-assembled monolayer. The SiN passivation layer was formed as the second insulating layer 8 on the single electron transistor produced like this, namely on the gold nanogap electrodes 5A and 5B and the $SiO_2$ layer 2.

The SiN passivation layer was formed in the following procedure. The produced single electron transistor was put into the vacuum chamber, and the temperature was controlled by water cooling so that the temperature of the single electron transistor would not exceed 65° C. In this condition, silane gas, ammonia gas and hydrogen gas were introduced into the vacuum chamber, and the SiN layer was deposited by the catalytic CVD method. In this Example 1, the SiN passivation layer was cooled so that its temperature would not exceed 65° C. to prevent destroying the single electron transistor due to heating. Although temperature is required to be 180° C. or less for depositing the passivation layer, the sample is cooled to keep the temperature as low as possible, preferably 65° C. or less, when depositing the layer.

Figure 11:
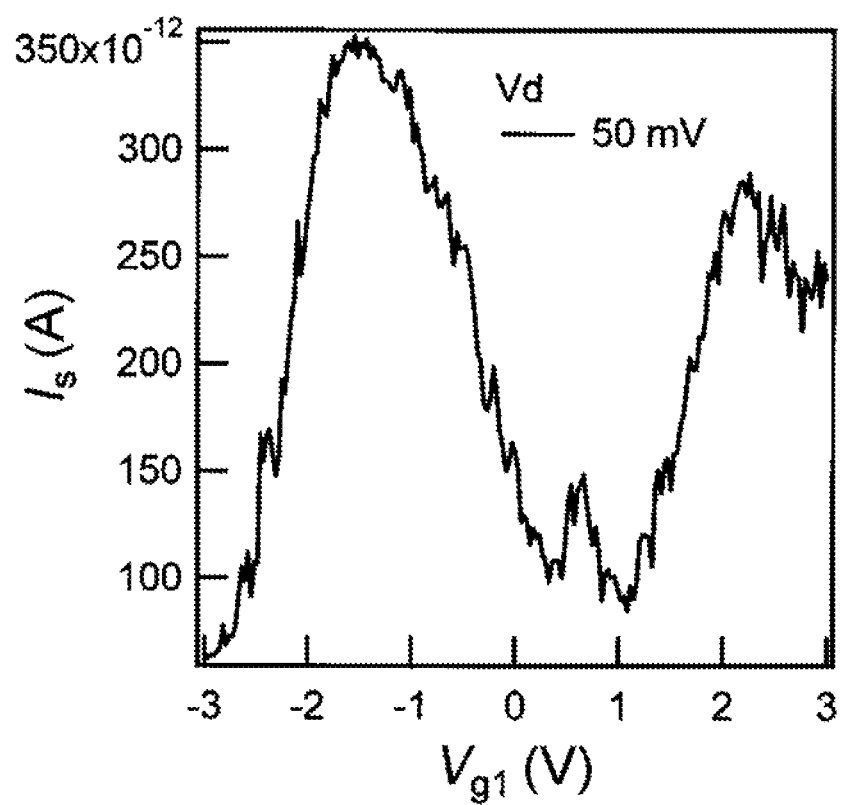
FIG. 11 is a view showing the drain current-side gate voltage dependency according to Example 1.

When the thickness of the SiN passivation layers was measured in ellipsometry measurement and by using a scanning electron microscope, the thickness was 50 nm in each case. For the single electron transistor 10 produced in Example 1, in the state where drain voltage Vd=50 mV was applied, the side gate voltage was swept and the drain current-side gate voltage dependency was measured. The measurement temperature was 9K. FIG. 11 shows the drain current-side gate voltage dependency. The horizontal axis shows the voltage Vg1 (V) applied to the first side gate and vertical axis shows the drain current (A). FIG. 11 indicates that the drain current can be modulated by the side gate voltage.

Figure 12:
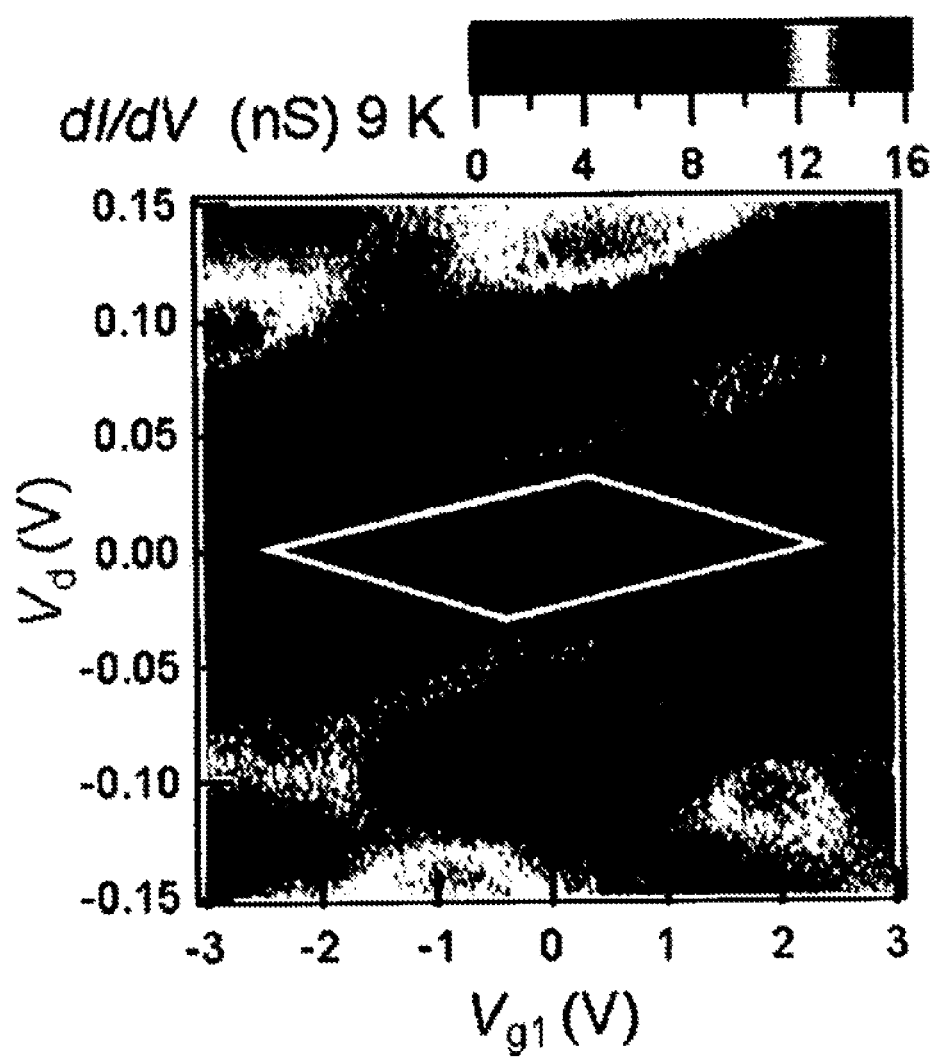
FIG. 12 is a view showing the mapping of the differential conductance according to Example 1 when the drain voltage and the side gate voltage are swept, respectively.

FIG. 12 shows the mapping of the differential conductance when the drain voltage and the side gate voltage are swept, respectively. The horizontal axis indicates the voltage Vg1 (V) applied to the first side gate, the vertical axis indicates the drain voltage Vd (V), and the contrasting density indicates the differential conductance for the drain current (A). The measurement temperature is 9K. It was found and observed that there was a voltage region shaped like a parallelogram and generally called a Coulomb diamond. This indicates that the element produced in Example 1 functions as a single electron transistor.

Figure 13:
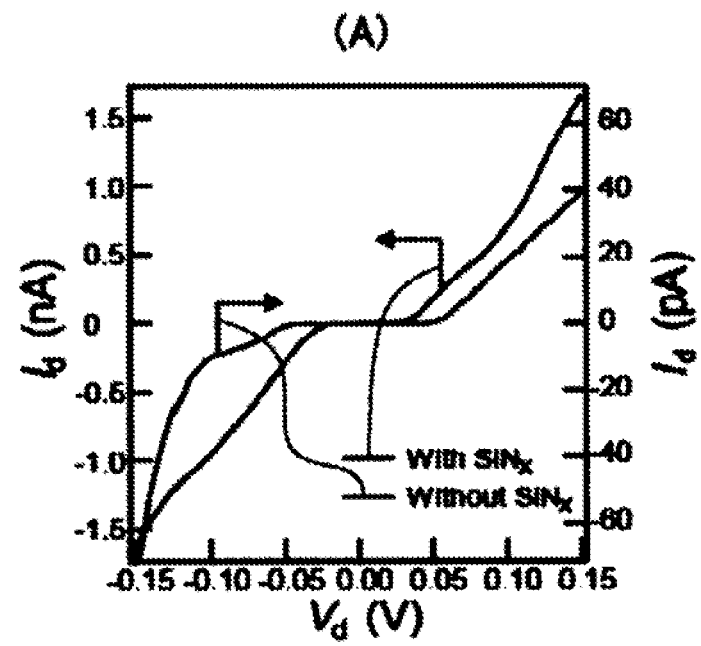
FIG. 13 shows the characteristics of the sample produced in Example 1; (A) shows the drain current Id when the drain voltage Vd is applied and (B) shows the drain current Id against the voltage Vg1 applied to the first side gate.
Figure 13:
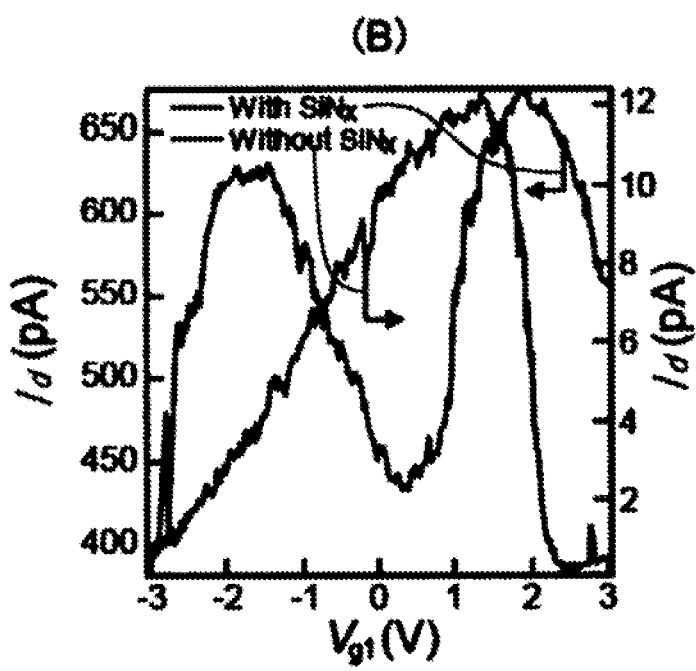

FIG. 13 shows the characteristics of the sample produced in Example 1, (A) shows the drain current Id when the drain voltage Vd is applied, and (B) shows drain current Id against the voltage Vg1 applied to the first side gate. In (A), the horizontal axis indicates the drain voltage Vd (V), the left vertical axis indicates the drain current Id (nA) when SiNx is deposited as the passivation layer, and right vertical axis indicates the drain current Id (pA) before depositing SiNx as the passivation layer. In (B), the horizontal axis indicates the voltage Vg1 (V) applied to the first side gate, the left vertical axis indicates the drain current Id (pA) when SiNx is deposited as the passivation layer, and the right vertical axis indicates the drain current Id (pA) before depositing SiNx as the passivation layer. The measurement temperature is 9K.

FIG. 13 (A) indicates that the drain current increases when SiNx is deposited. The relative permittivity of deposited SiNx was 7.5 in the electrostatic capacitance measurement at the capacitance where SiNx was placed between the opposite electrodes when AC voltage was applied. In addition, from FIG. 13 (B), Coulomb blockade effect was confirmed even when SiNx was deposited.

Example 2

Figure 14:
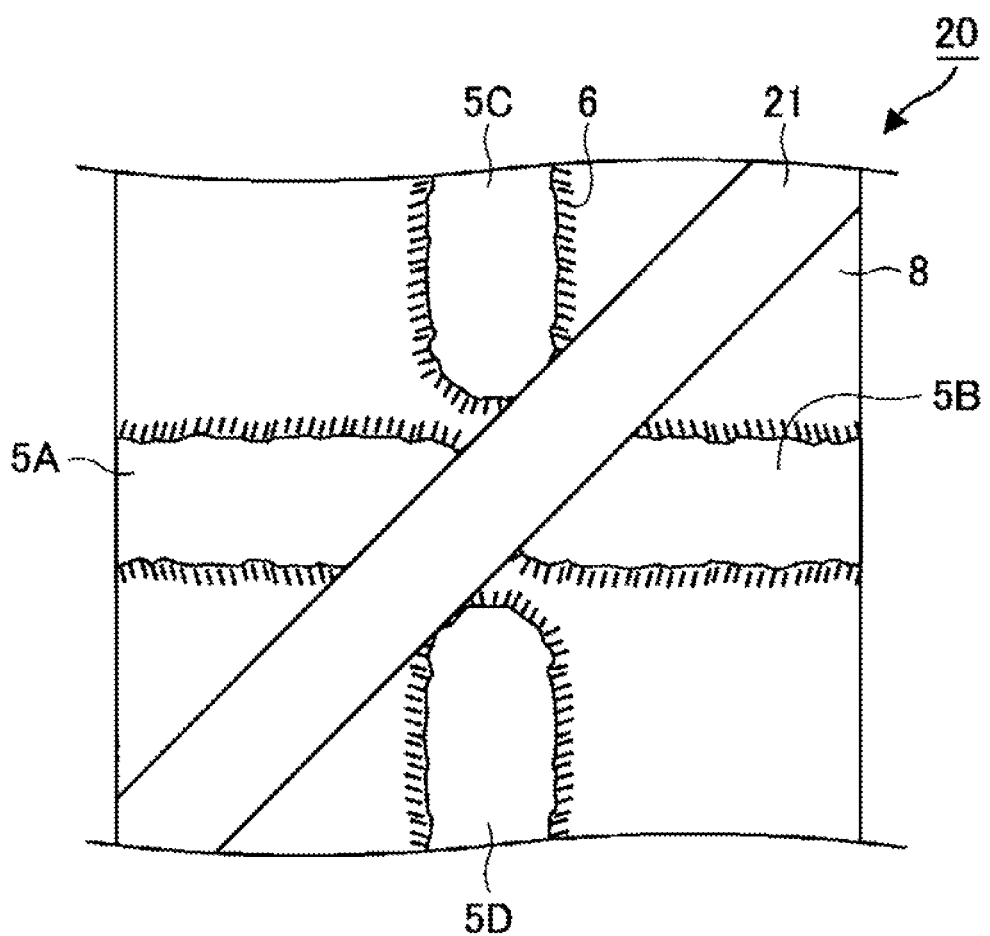
FIG. 14 is a plan view of the single electron transistor produced in Example 2.
Figure 15:
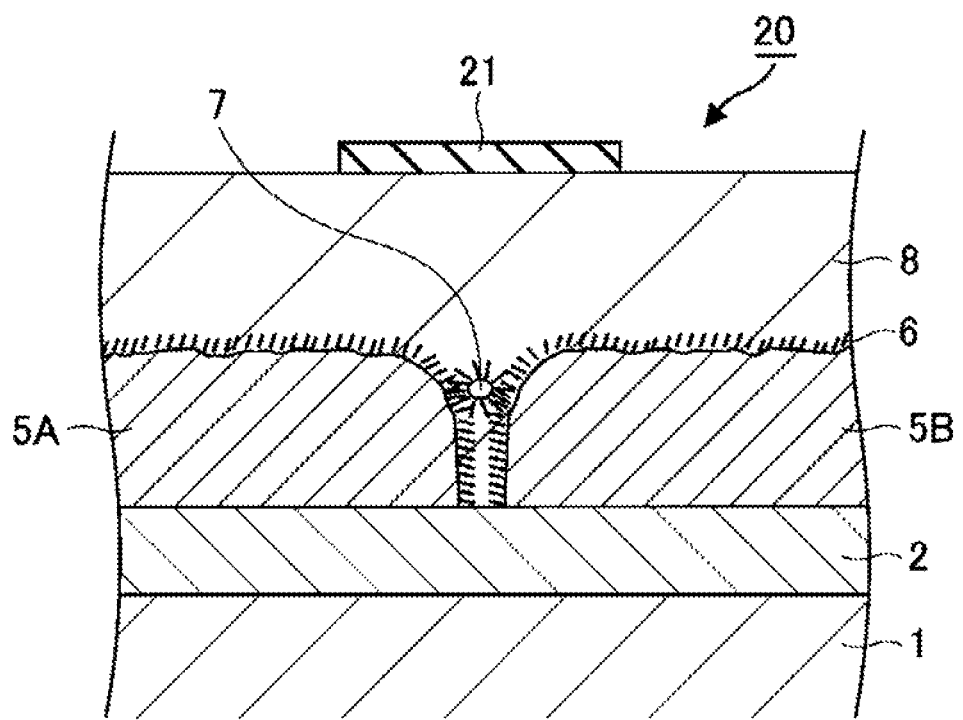
FIG. 15 is a cross-sectional view of the single electron transistor produced in Example 2.

FIG. 14 shows a plain view of the single electron transistor produced in Example 2, and FIG. 15 shows its cross-sectional view. In Example 2, same as Example 1, the gold nanoparticle 7 was placed between the gold nanogap electrodes 5A and 5B and the SiN passivation layer was formed as the second insulating layer 8 on the top to produce the single electron transistor. Subsequently, resist was applied on this single electron transistor and an electrode pattern was drawn immediately above the gold nanogap portion by using the electron beam lithography method. After development, the Ti layer of 30 nm and the Au layer of 70 nm were deposited in that order in electron beam evaporation. Thus, the top gate electrode 21 was placed just above the gold nanogap with the SiN layer in between as the second insulating layer 8.

Figure 16:
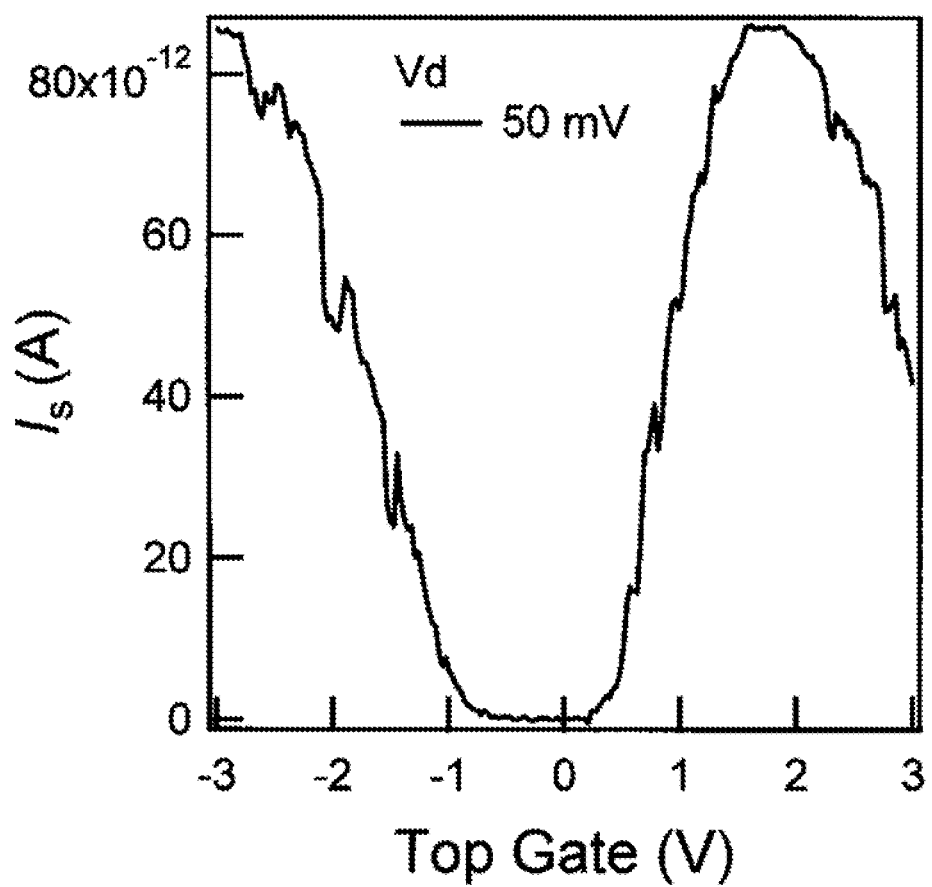
FIG. 16 is a view showing drain current-top gate voltage dependency in the single electron transistor produced in Example 2, obtained when the top gate voltage is swept.

In the produced single electron transistor, the top gate voltage was swept in the state where the drain voltage Vd was applied stably at 50 mV, drain current-top gate voltage were measured. The measurement temperature was 9K. FIG. 16 shows the measurement results of drain current-top gate voltage dependency. The horizontal axis shows the top gate electrode voltage (V) and the vertical axis shows the drain current Is (A). As shown in FIG. 16, it was found that the drain current could be modulated by the side gate voltage.

Figure 17:
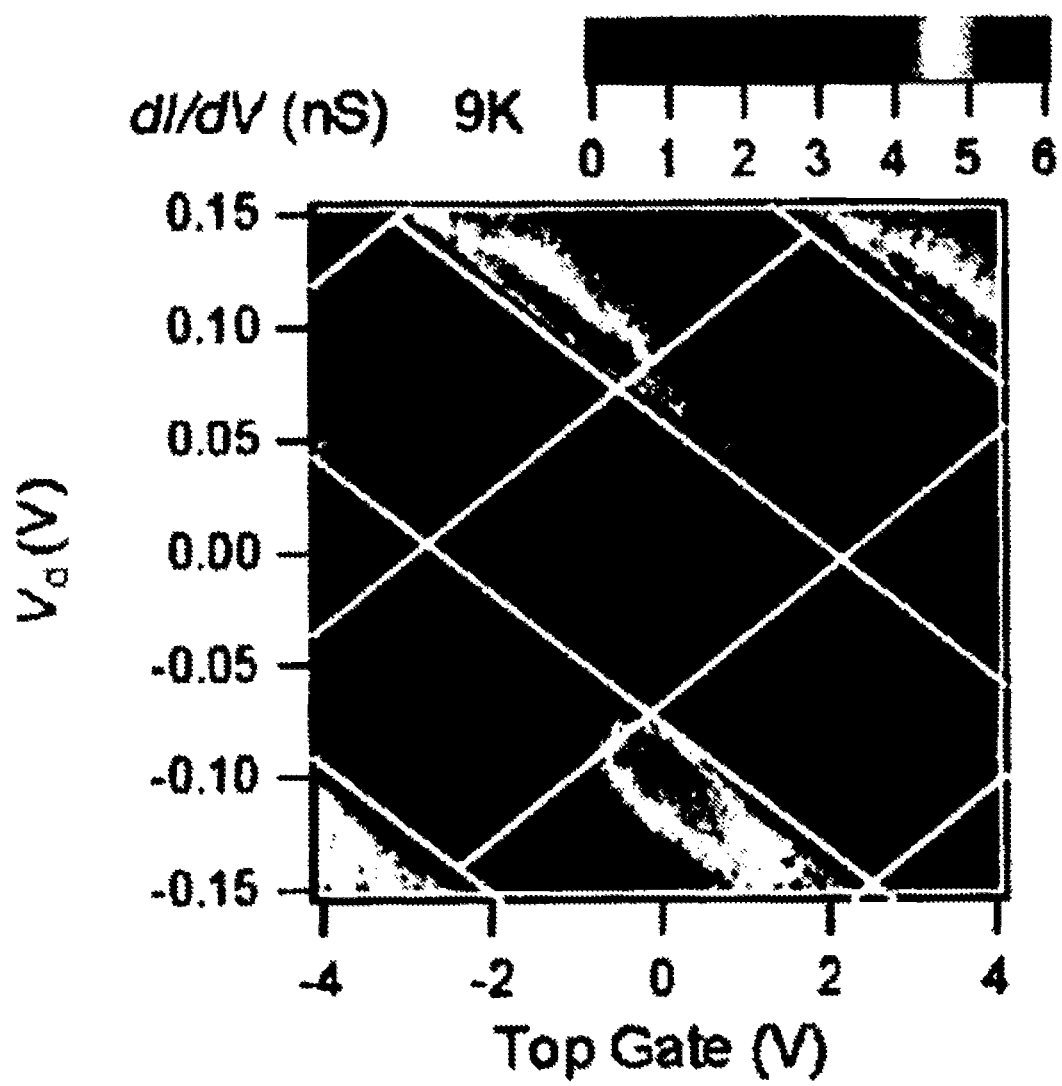
FIG. 17 is a view showing the mapping of the differential conductance according to Example 2 when the drain voltage and the side gate voltage are swept, respectively.

FIG. 17 shows the mapping of the differential conductance when the drain voltage and the side gate voltage are swept, respectively. The horizontal axis indicates the voltage (V) applied to the top gate, the vertical axis indicates the drain voltage Vd (V), and the contrasting density indicates the differential conductance of the drain current (A). The measurement temperature was 9K. It was observed that there was a voltage region shaped like a parallelogram, generally called a Coulomb diamond and caused by restriction of the current between the drain and the source. This indicates that the element produced in Example 2 functions as a single electron transistor.

Figure 18:
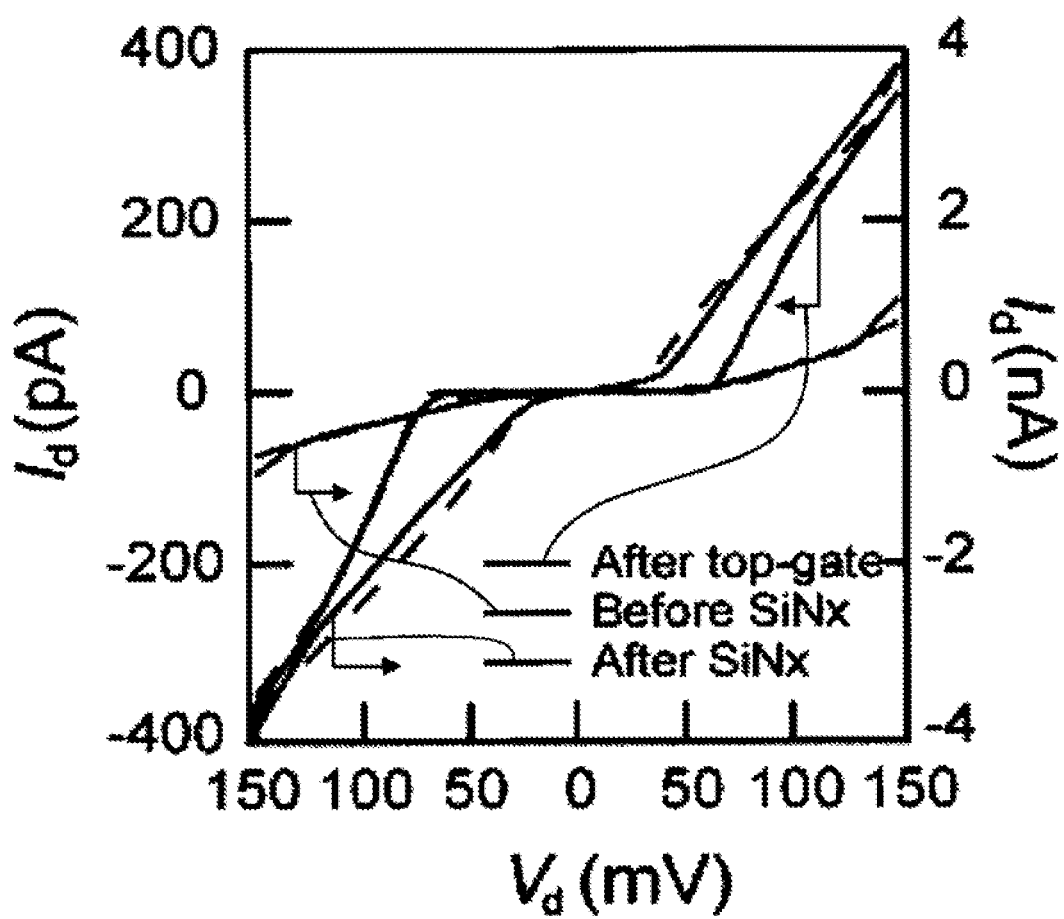
FIG. 18 is a view showing the drain current against the drain voltage in Example 2.

FIG. 18 shows the drain current against the drain voltage in the samples produced in Example 2. The measurement temperature was 9K. The horizontal axis shows the drain voltage Vd (mV), the left vertical axis shows the drain current Id (pA), and right vertical axis shows the drain current Id (nA). The drain current is within the range of ±about 100 pA before depositing SiNx as the passivation layer, but the drain current becomes larger within the range of ±400 pA after depositing SiNx, and the width of the drain voltage Vd where the drain current Id does now flow becomes also larger. In addition, the drain current is ±4 nA after depositing the top gate.

In Example 2 where the top gate is provided, the Coulomb diamond is clear compared with Example 1.

Figure 19:
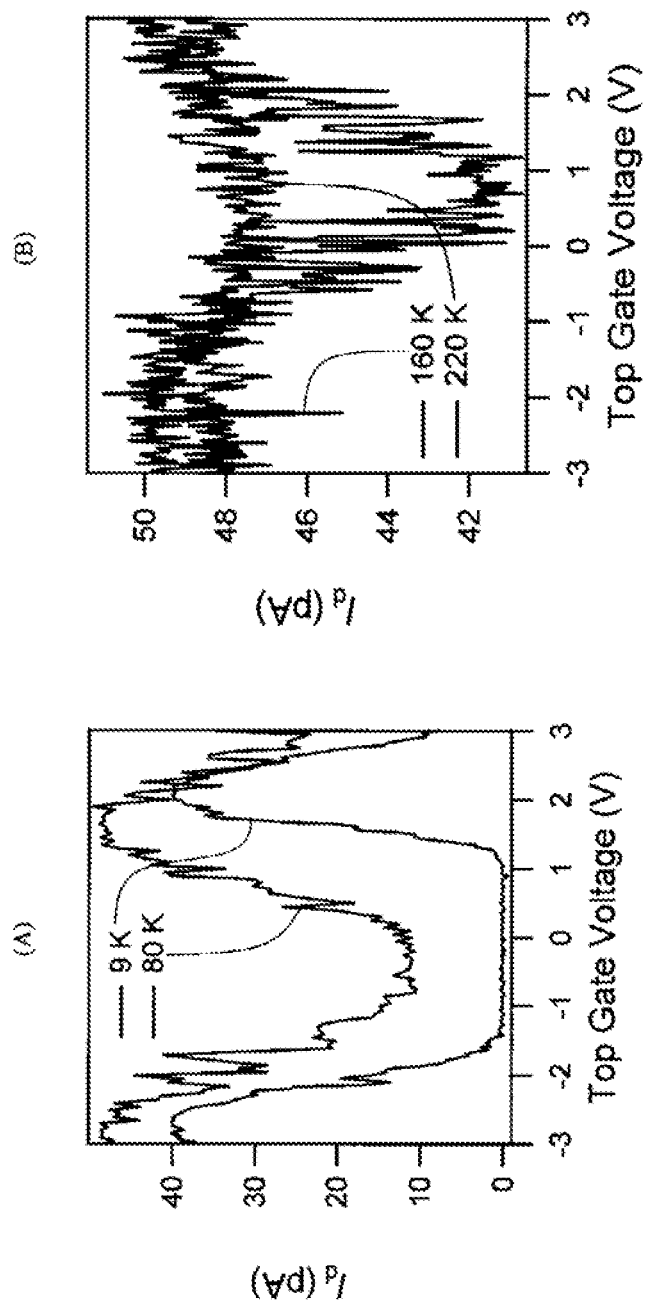
FIG. 19 shows the dependency of the drain current on the top gate voltage, which is so-called Coulomb oscillation characteristics, according to Example 2; (A) shows that at the measuring temperature of 9K and 80K, and (B) shows those at the measurement temperature of 160K and 220K.

FIG. 19 shows the dependency of the drain current on the top gate voltage, which is so-called Coulomb oscillation characteristics, (A) shows the characteristics at the measurement temperature of 9K and 80K and (B) shows those at the measurement temperature of 160K and 220K. At the respective temperatures, the drain current increases and decreases repeatedly by the sweep of the gate voltage. At the low temperature of 9K, the zero current range is clearly observed in the gate voltage range of −1.5 to 1.2V. As the measurement temperature increases to 80K, 160K and 220K, the minimum current value when the gate voltage is swept becomes gradually higher. This is caused because the ratio of charging energy Ec, which is equivalent to the system energy change when one electron enters the single electron island, to the thermal fluctuation $K_B T$, namely $Ec/K_B T$, becomes smaller as the temperature rises and the Coulomb blockade phenomenon does not occur easily. $K_B$ is a Boltzmann constant. However, Coulomb oscillation caused by gate voltage sweep is also observed at 220K, and so the single electron transistor passivated by SiNx functions also at 220K.

Figure 20:
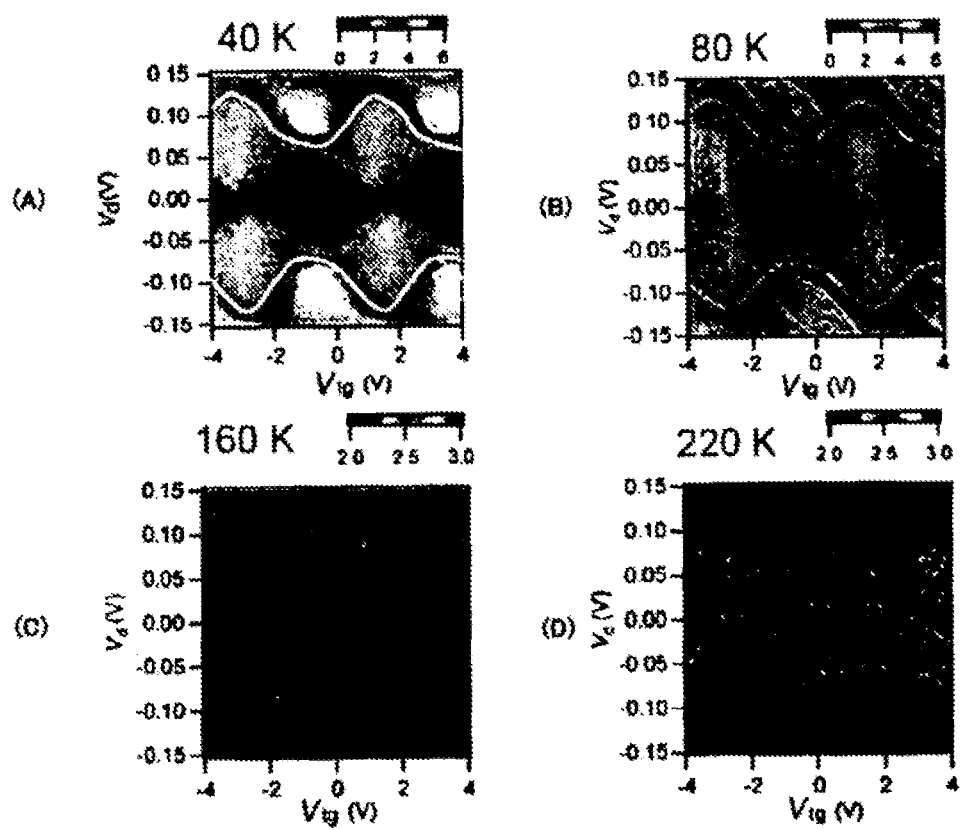
FIG. 20 shows the mapping of the differential conductance according to Example 2; (A), (B), (C) and (D) show the mappings at the measuring temperature of 40K, 80K, 160K and 220K, respectively.

FIG. 20 shows the mapping of the differential conductance, and (A), (B), (C) and (D) show the mappings at the measuring temperature of 40K, 80K, 160K and 220K, respectively. The horizontal axis indicates the gate voltage and the vertical axis indicates the drain voltage. When the measurement temperature is increased to 40K, 80K, 160K and 220K, the Coulomb diamond becomes unclear, but it is indicated that the characteristics as the single electron element are maintained even at 220K.

Example 3

In Example 3, AlOx is deposited as a passivation layer at room temperature and the top gate electrode is set on it, and so Example 3 is different from Example 2 in this point. The pulsed laser deposition method was used to deposit AlOx. The EBL method was used for the top gate to have a double layer structure of Ti and Au layers.

Figure 21:
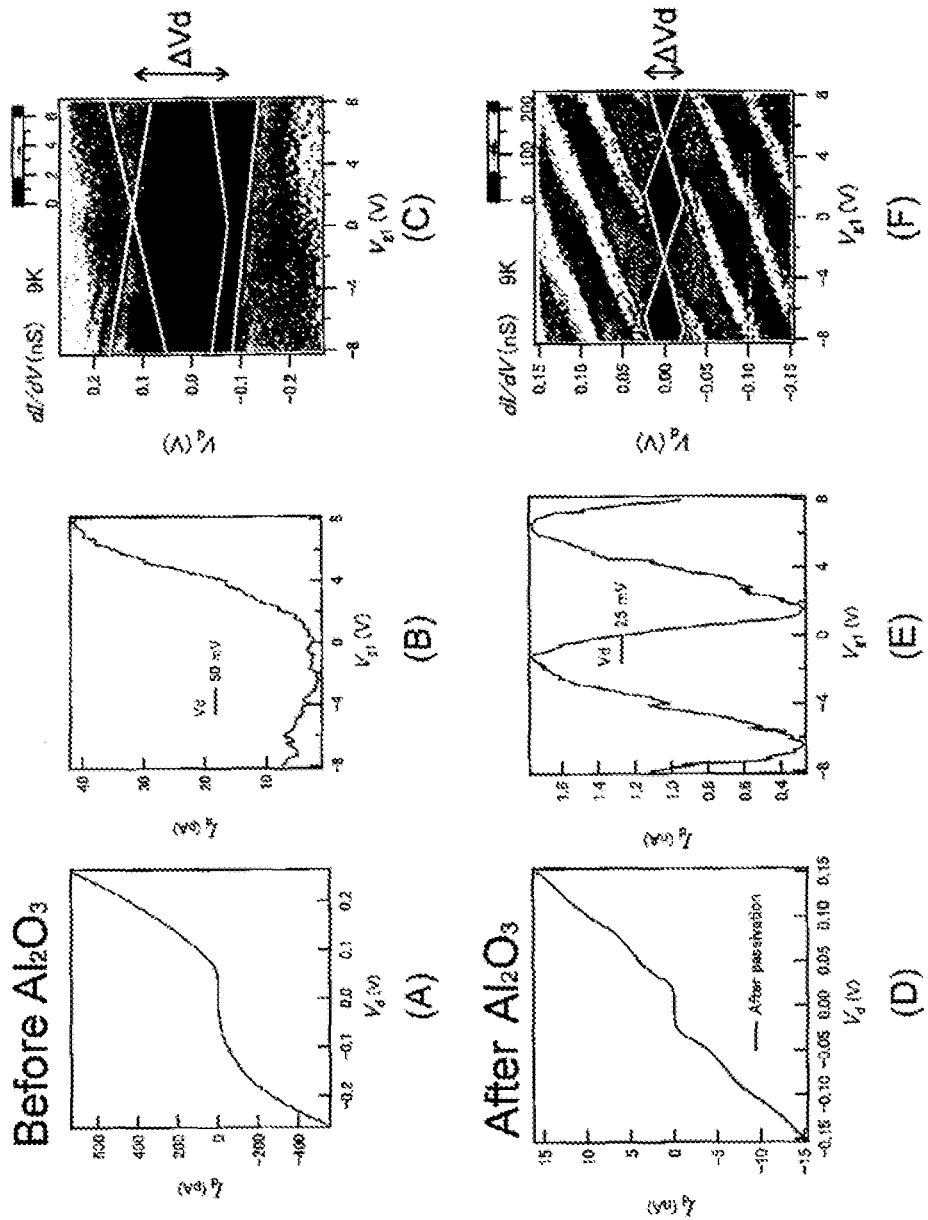
FIGS. 21 (A) and (D) show the drain current characteristics against the drain voltage, FIGS. 21 (B) and (E) show drain current characteristics against the voltage applied to the side gate, and FIGS. 21 (C) and (F) show dI/dV (nS) against the side gate voltage and the drain voltage, according to Example 3.

In FIG. 21, (A) and (D) show the drain current characteristics against the drain voltage, (B) and (E) show drain current characteristics against the voltage applied to the side gate, and (C) and (F) show dI/dV (nS) against the side gate voltage and the drain voltage. (A) to (C) show the characteristics before depositing $Al_2O_3$, and (D) to (F) show the characteristics after depositing $Al_2O_3$. The measurement temperature is 9K. It is indicated that the current values are higher in this case than those when SiNx is deposited as a passivation layer. When the gate voltage width equivalent to one cycle of Coulomb oscillation is $\Delta V$, the gate capacitance is $e/\Delta V$ (e is elementary charge). When (B) and (E) are compared, the cycle of Coulomb oscillation becomes smaller after depositing $Al_2O_3$. This indicates that when $Al_2O_3$ is deposited, the space between the side gate and the Coulomb island is filled with $Al_2O_3$ of high electric permittivity and the gate capacitance becomes larger. Also by comparing (C) and (F), it is clear that the space around the Coulomb island is filled with $Al_2O_3$. When the peak width of the drain voltage direction of the Coulomb diamond is $\Delta Vd$, the charging energy Ec is $Ec=e\Delta Vd/4$. Since $\Delta Vd$ in (F) is about 50 mV while $\Delta Vd$ in (C) is about 200 mV, the charging energy is reduced to about ¼ by depositing $Al_2O_3$.

Figure 22:
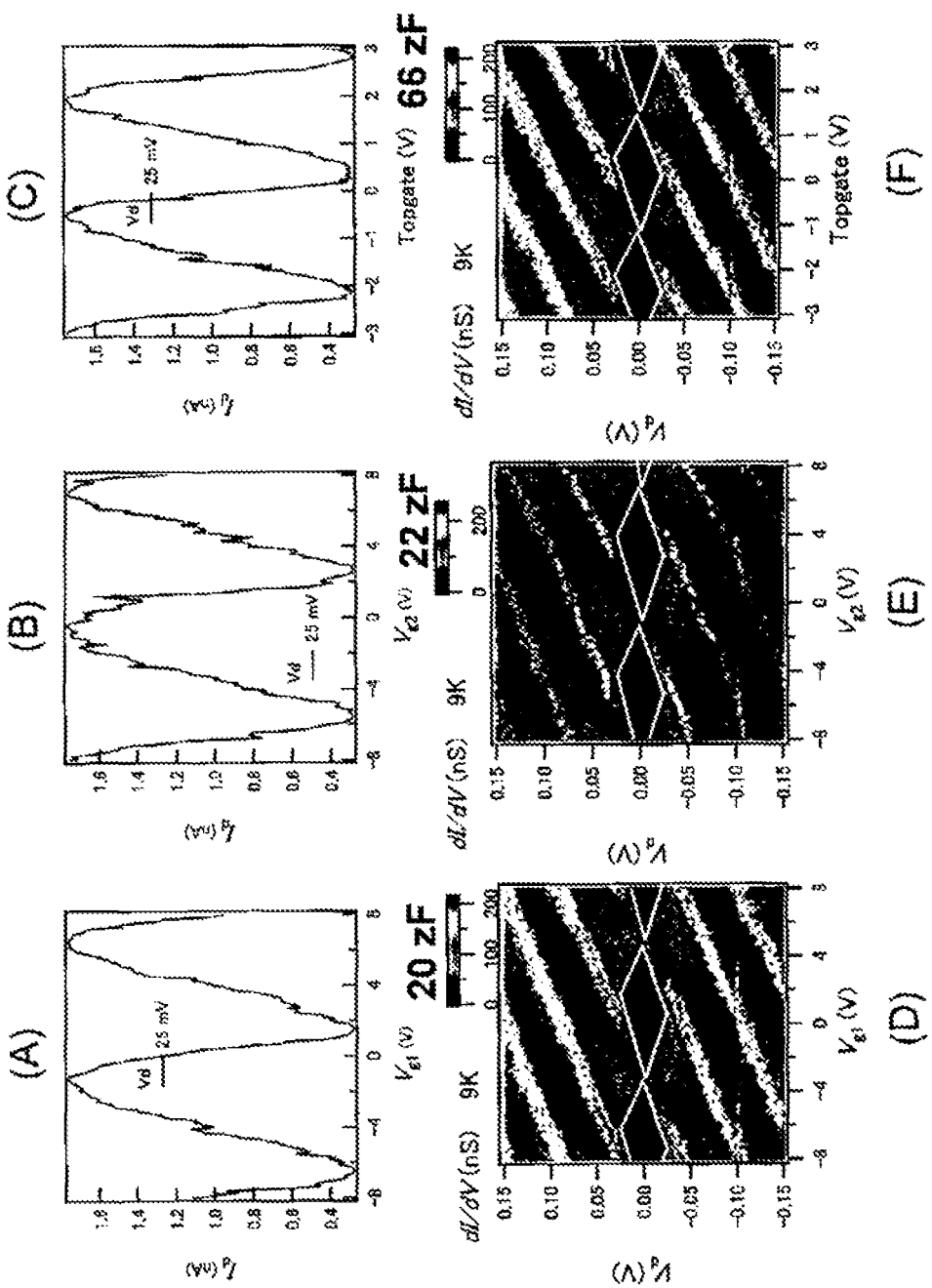
FIG. 22 is a view showing the characteristics when voltage is applied to the one side gate, other side gate and top gate according to Example 3; (A) to (C) show the drain current characteristics against the voltage applied to the one side gate, other side gate and top gate, respectively, (D) to (F) show dI/dV against the voltage, which is applied to the one side gate, other side gate and top gate, and the drain voltage, respectively.

FIG. 22 shows the characteristics when voltage is applied to the one side gate, other side gate and top gate. The measurement temperature is 9K. The (A) to (C) show the drain current characteristics (Coulomb oscillation) against the voltage applied to the one side gate, other side gate and top gate. (D) to (F) show dI/dV (nS) (stability diagram) against the voltage, which is applied to the one side gate, other side gate and top gate, and the drain voltage. It is indicated that more stable oscillation occurs in this case than when SiNx is used for a passivation layer.

Example 4

Figure 23:
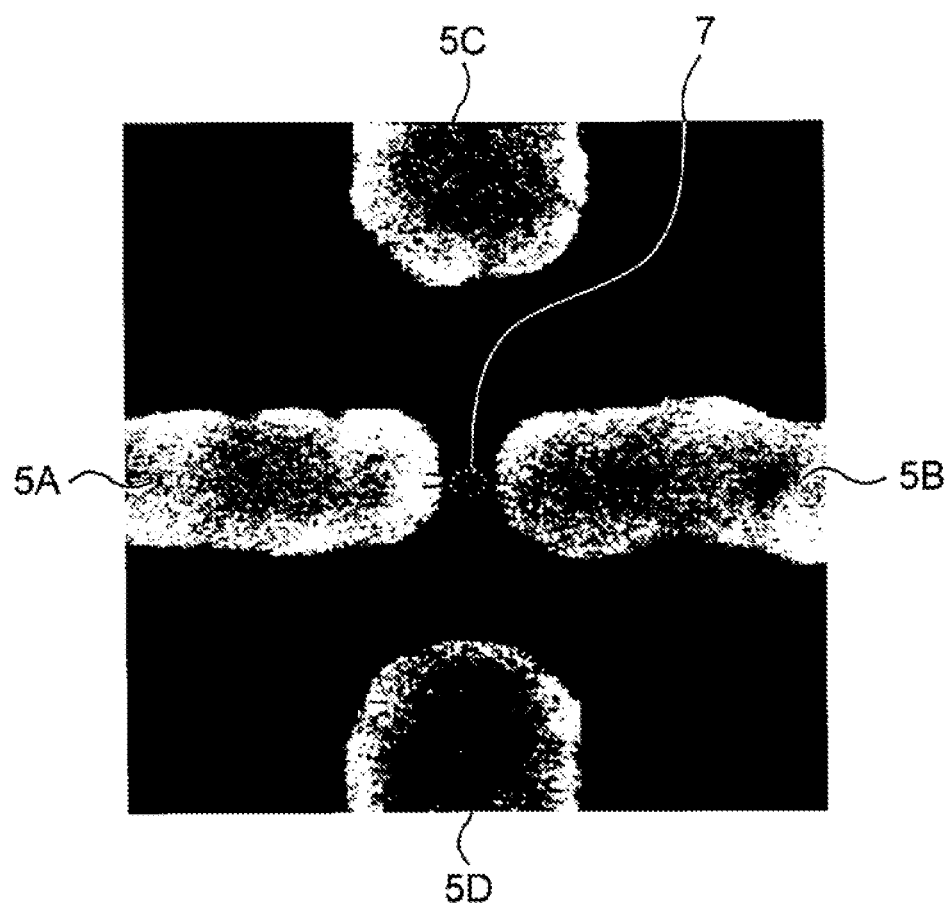
FIG. 23 is a SEM image of the single electron transistor in production according to Example 4.

In Example 4, a single electron transistor was produced same as Example 1. FIG. 23 shows a SEM image of the single electron transistor in production for Example 4. As shown by the SEM image in FIG. 23, the gold nanoparticle 7 was placed, with the insulating layer 6 in between, between the one electrode 5A and the other electrode 5B, almost in the center of horizontal and vertical directions in the plain view of the nanogap, and then SiNx was deposited as a passivation layer.

Figure 24:
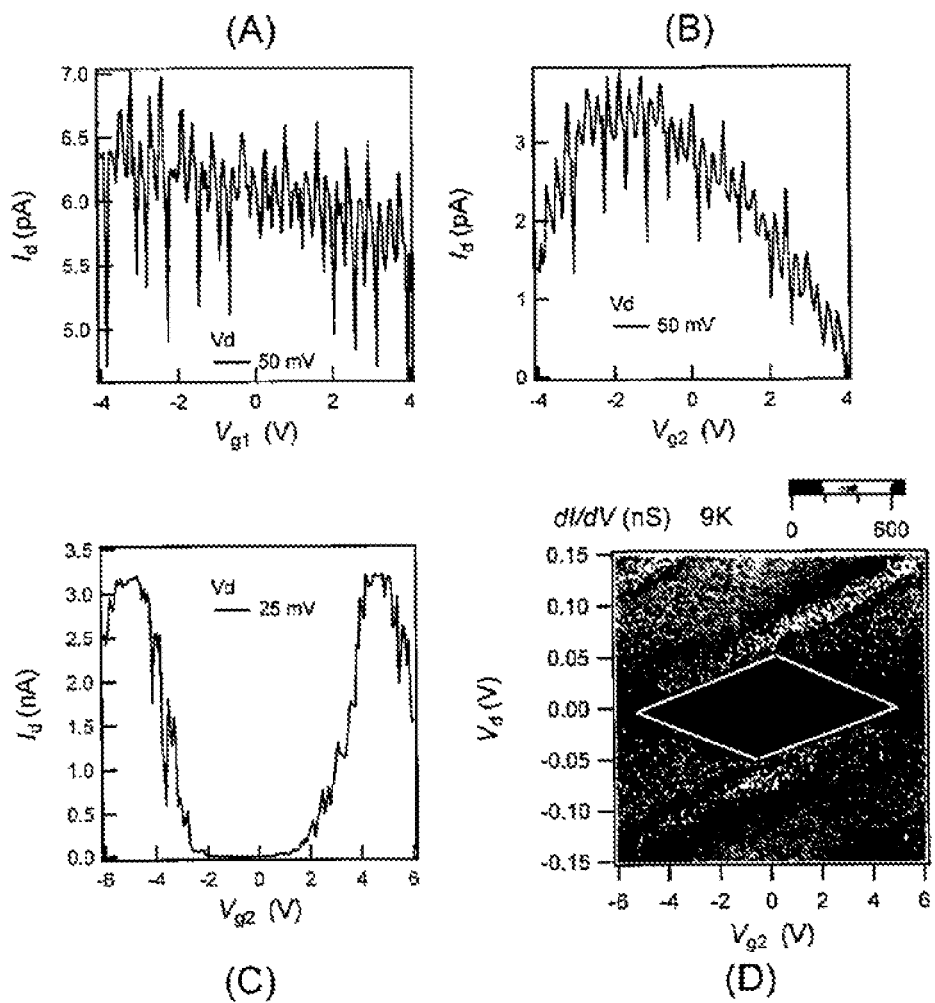
FIG. 24, according to Example 4, (A) and (B) are views showing the dependency of the drain current on the voltage applied to the first side gate electrode and the dependency of the drain current on the voltage applied to the second side gate electrode, respectively, (C) is a view showing the dependency of the drain current on the voltage applied to the second side gate electrode, and (D) is a view showing dI/dV (differential conductance) for the second side gate voltage and the drain voltage.

In FIG. 24 for Example 4, (A) and (B) show the dependency of the drain current on the voltage applied to the first side gate electrode and the dependency of the drain current on the voltage applied to the second side gate electrode, respectively, and measurement was taken for the samples before depositing SiNx in both cases. (C) shows the dependency of the drain current on the voltage applied to the second side gate electrode, and (D) shows dI/dV (differential conductance) for the second side gate voltage and the drain voltage. (C) and (D) show the measurement of the samples after depositing SiNx. The measurement temperature is 9K in each case.

In FIG. 24, before passivation, the gate capacitance is slightly larger in the second side gate electrode 5D than in the first side gate electrode 5C, but this difference is not significant different from Example 5 described later. This indicates that the gold nanoparticle 7 is located almost at the center of the nanogap in the vertical direction in the SEM image, namely almost at the central axis for the one electrode 5A and the other electrode 5B. After the passivation, one cycle of Coulomb oscillation is observed and the gate capacitance is larger. In example 4, since the gold nanoparticle 7 is located in the center of the nanogap, the effect of nanogap electrodes 5a and 5B surrounding the gold nanoparticle 7 is high, the deposition is performed without causing any destruction during the passivation process.

Example 5

Figure 25:
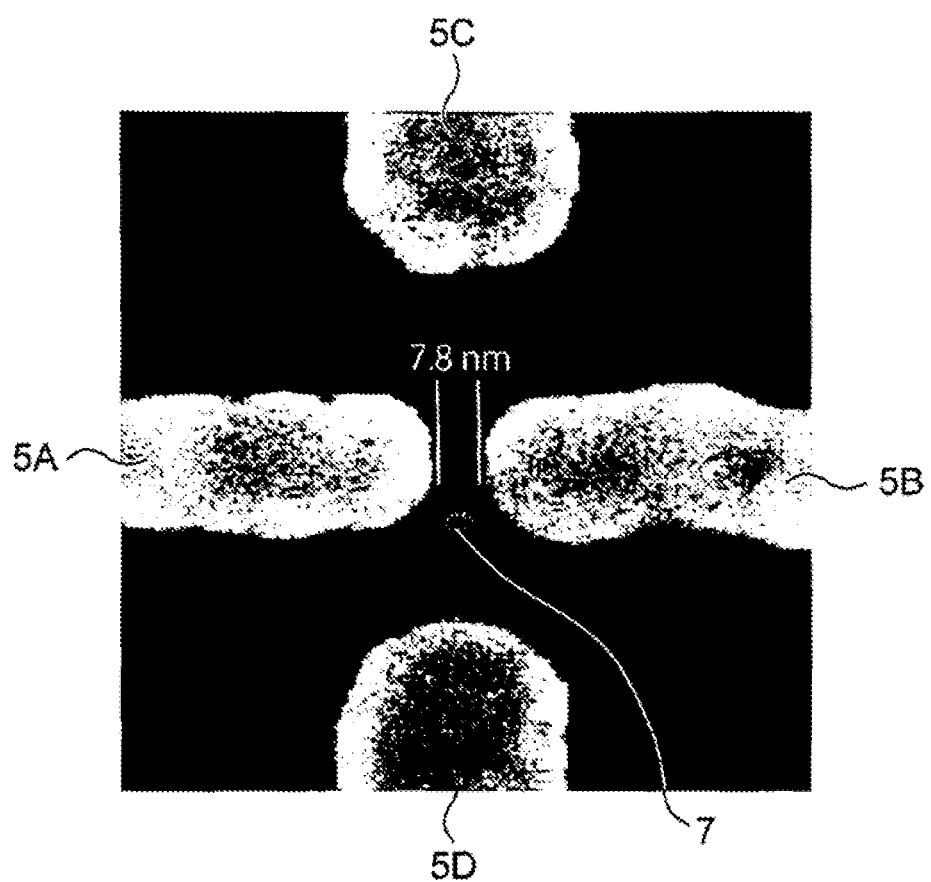
FIG. 25 is a SEM image of the single electron transistor in production according to Example 5.

In Example 5, a single electron transistor was produced same as Example 1. FIG. 25 shows a SEM image of the single electron transistor in production for Example 5. As shown by the SEM image in FIG. 25, the gold nanoparticle 7 was placed, with the insulating layer in between, almost at the center between the one electrode 5A and the other electrode 5B in the right-and-left direction and near the lower end in the plain view of the nanogap, and then SiNx was deposited as a passivation layer. Other details are the same as other Examples.

Figure 26:
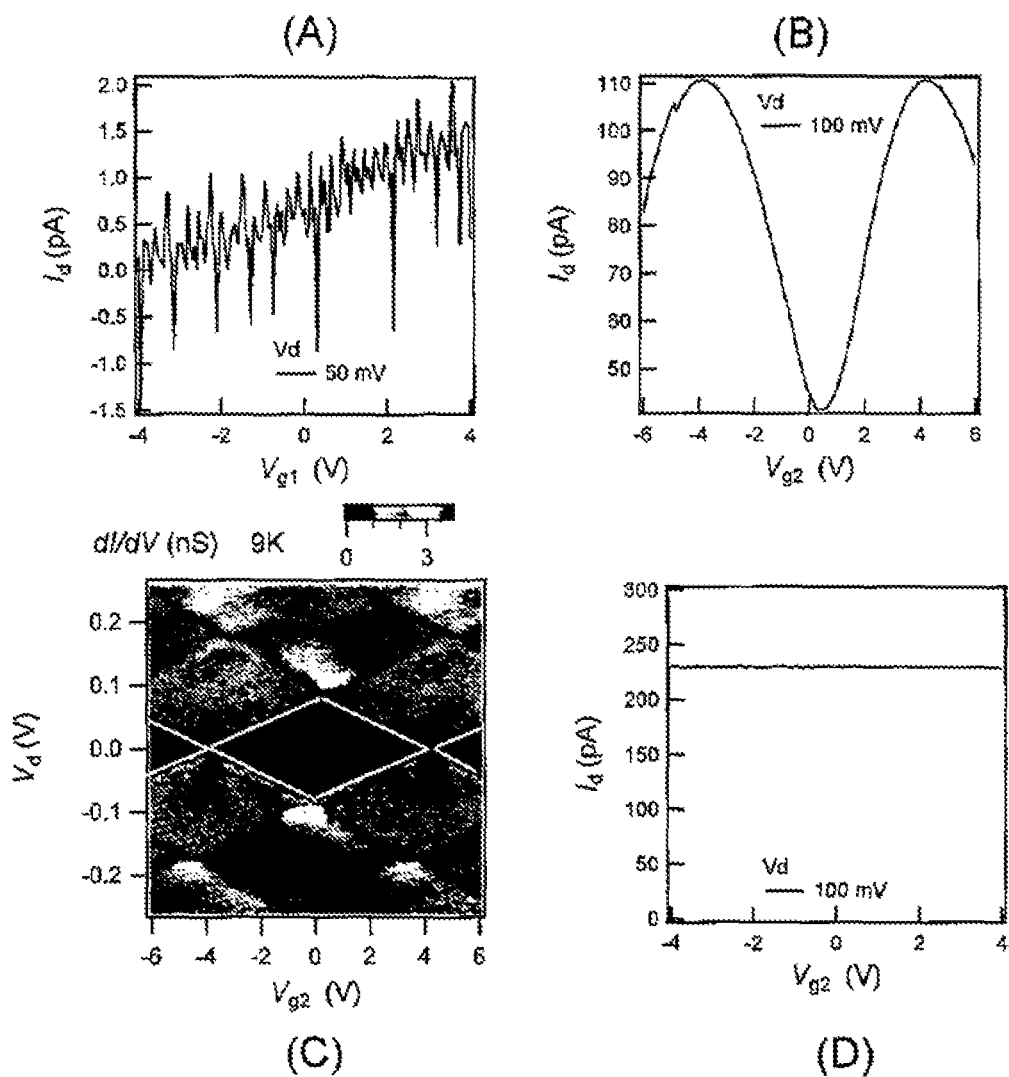
FIG. 26, according to Example 5, (A), (B), and (C) are views showing the dependency of the drain current on the voltage applied to the first side gate electrode, the dependency of the drain current on the voltage applied to the second side gate electrode, and dI/dV (differential conductance) for the second side gate voltage and the drain voltage, respectively, and (D) is a view showing the dependency of the drain current on the voltage applied to the second side gate electrode.

FIG. 26 relates to Example 5, and (A), (B) and (C) show the dependency of the drain current on the voltage applied to the first side gate electrode, the dependency of the drain current on the voltage applied to the second side gate electrode, and dI/dV (differential conductance) for the second side gate voltage and the drain voltage, respectively, and the measurement was taken for the samples before depositing SiNx in each case. (D) shows the dependency of the drain current on the voltage applied to the second side gate electrode and the measurement result of the sample after depositing SiNx. The measurement temperature is 9K in each case.

FIG. 26 shows the characteristics before and after the passivation. In the Coulomb oscillation of the first side gate, the current increases gradually between −4V and 4V. However, for the second side gate, the peak value of current is observed near −3.5V and 4.5V, respectively, and Coulomb oscillation for one cycle is observed. This indicates that since the gold nanoparticle 7 is located near the second side gate electrode 5D and the nanogap separation is slightly larger than the nanoparticle, Coulomb oscillation by the first side gate is slightly observed. The current becomes a constant value after the passivation. This indicates that the nanoparticle was destroyed by passivation, the core gold between the electrodes was destroyed and so a conduction path was formed.

The following was found by comparing Examples 4 and 5. A conduction path by destruction of the Au nanoparticle 7 caused by passivation is likely to occur when the Au nanoparticle 7 is located near the lower end between the nanogap electrodes in the cross-sectional view, namely near the $SiO_2$ substrate. If the gold nanoparticle 7 is located near the $SiO_2$ when the Au nanoparticle 7 is destroyed by passivation, then the core gold, having $SiO_2$ surface as a support face, may electrically connect between the electrodes and may form a conduction path. However, if the Au nanoparticle 7 is located at the center or near the upper end in the cross-sectional view, a conduction path is less likely to be formed because there is no support surface although gold adheres to the nanogap electrode surface even when the Au nanoparticle is destroyed.

Example 6

In Example 6, same as Embodiment 2 in the present invention, the gold nanoparticle 7 is placed, with the insulating layer in between, almost at the center between the one electrode 5A and the other electrode 5B in the right and left direction and near the lower end in the plain view of the nanogap, and the SiNx is deposited as a passivation layer. Subsequently, the top gate is placed on the passivation layer and immediately above the metal nanoparticle. Other details are the same as those for other Examples.

Figure 27:
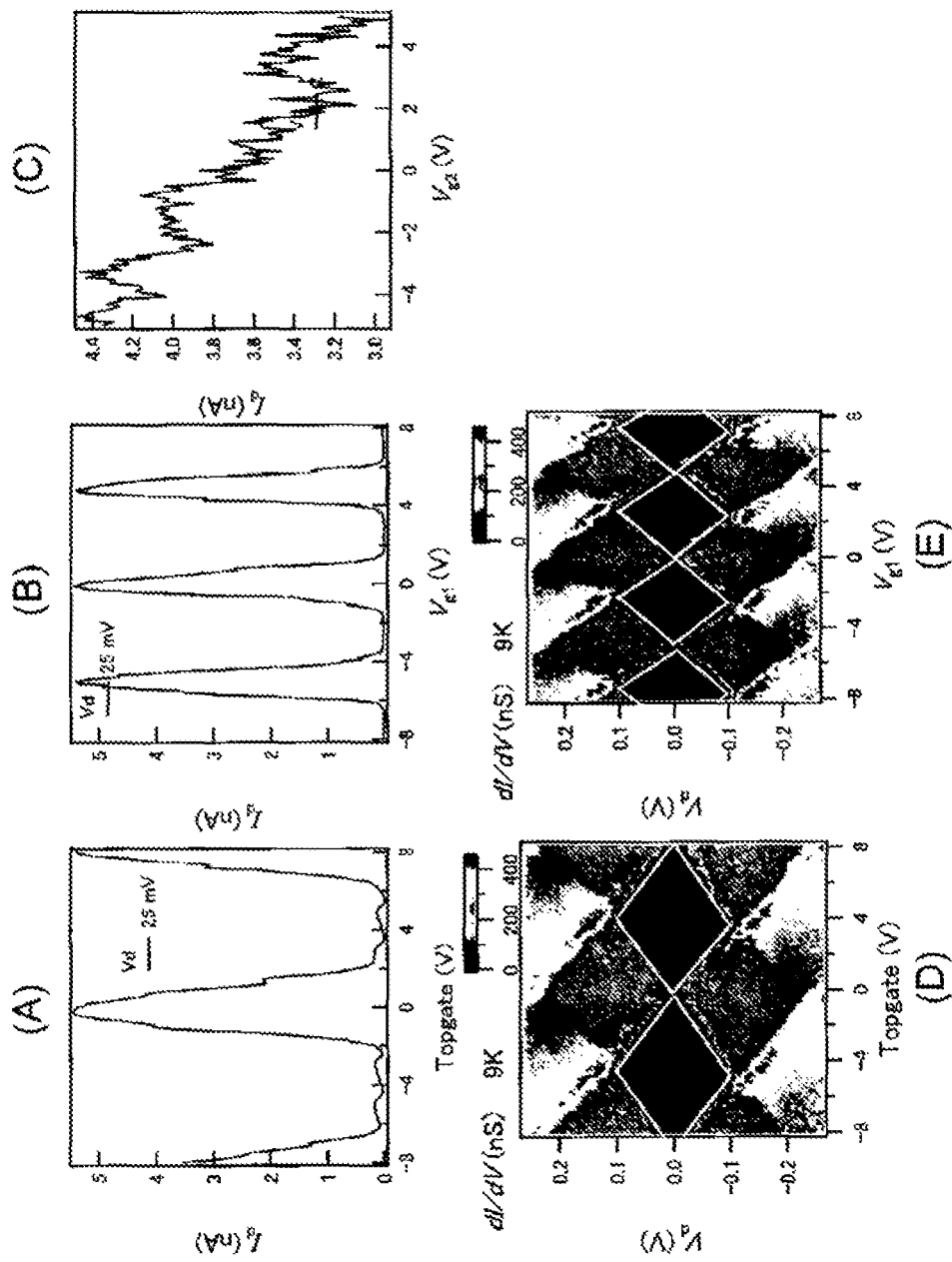
FIG. 27, according to Example 6, (A), (B), and (C) are views respectively showing the dependency of the drain current on the voltage applied to the top gate electrode, first side gate electrode and second side gate electrode, respectively, (D) is a view showing the dI/dV (differential conductance) for the top gate voltage and the drain voltage, and (E) shows dI/dV (differential conductance) for the first side gate voltage and the drain voltage. (0079)

FIG. 27 relates to Example 6, and (A), (B) and (C) show the dependency of the drain current on the voltage applied to the top gate electrode, first side gate electrode and second side gate electrode, respectively, (D) shows the dI/dV (differential conductance) for the top gate voltage and the drain voltage, and (E) shows dI/dV (differential conductance) for the first side gate voltage and the drain voltage. The measurement temperature is 9K.

FIG. 27 confirms the Coulomb oscillation in the top gate, first side gate and second side gate after the passivation, respectively, and the Coulomb oscillation in the top gate and the first side gate. Based on the Coulomb oscillation interval, the gate capacitance is the largest in the first side gate and becomes smaller in the order of the top gate and the second side gate. Since the gate capacitance of the first side gate is larger than that of the top gate, the nanoparticle (Coulomb island) is located near the nanogap electrode substrate and near the first side gate. Therefore, the gate capacitance of the first side gate becomes larger than that of the top gate. In addition, since Coulomb oscillation of the second side gate is observed, it is expected that the gap separation is slightly larger than the nanoparticle diameter and it is indicated that the gold nanoparticle is located nearer the first side gate than the second side gate 2 and near the substrate. Thus, by comparing the gate capacitances, the shape of nanogap electrode and the position of nanoparticle existing in the nanogap can be found.

The present invention is not limited to the Embodiments and Examples, but can be modified in various ways for use within the range of the invention indicated in the scope of the patent claims.

According to the Embodiments of the present invention, a metal nanoparticle or a functional molecule can be placed between nanogap electrodes, an insulating film can be placed between the metal nanoparticle and the nanogap electrode, and this or these can be covered by an inorganic insulating layer. Therefore, logic circuit elements, memories and sensor circuits including single electron transistors integrated three-dimensionally can be produced by setting a top gate electrode on the inorganic insulating layer, setting another transistor, and connecting this device by wiring to various electron elements such as a CMOS circuit formed on a semiconductor substrate.

What is claimed is:

1. A nanodevice, comprising:
a first insulating layer;
one and the other electrodes provided to have a nanogap on the first insulating layer;
a metal nanoparticle or functional molecule provided between the one and the other electrodes;
a second insulating layer provided on the first insulating layer, and on the one and the other electrodes to embed the metal nanoparticle or the functional molecule;
one or more side gate electrodes provided on the first insulating layer in a direction crossing a direction in which the one and the other electrodes are provided, the side gate electrode(s) covered with the second insulating layer; and
a top gate electrode provided on the second insulating layer,
wherein a monolayer as a part of the second insulating layer is interposed between the metal nanoparticle and the one electrode and between the metal nanoparticle and the other electrode, or
wherein the functional molecule comprises an anchor part to be fixed on the one and the other electrodes.

2. The nanodevice according to claim 1, wherein the second insulating layer includes any one of SiN, SiO, SiON, $Si_3N_4$, $SiO_2$, $Al_2O_3$, and MgO.

3. An integrated circuit, wherein the nanodevice according to claim 1 and an electronic device are formed on a semiconductor substrate.

4. The nanodevice according to claim 1, wherein the metal nanoparticle is located at a vertical center of the one and the other electrodes or near an upper than the vertical center in a cross-sectional view, the metal nanoparticle is fixed in the second insulating layer.

5. The nandevice according to claim 1, wherein the metal nanoparticle is insulated from the one and the other electrodes by chemical bonding of alkanethiol as protecting group of the metal nanoparticle and a defective part of molecular constructing the monolayer, the metal nanoparticle is provided between the one and the other electrodes.

6. The nanodevice according to claim 1, wherein the metal nanoparticle is absorbed on at least one of the electrodes by alkanedithiol.

7. A method for fabricating the nanodevice according claim 1, comprising:

preparing a substrate with an insulating layer provided with: the one and the other electrodes having a nanogap on the first insulating layer; and one or more side gate electrodes provided in a direction crossing a direction in which the one and the other electrodes are provided,
providing a metal nanoparticle or a functional molecule between the one and the other electrodes; and
forming second insulating layer on the one and the other electrodes, the side gate electrode(s) and the substrate with the insulating layer,
whereby the metal nanoparticle or the functional molecule is embedded; and
forming a top gate electrode on the second insulating layer.

8. The method for fabricating a nanodevice according to claim 7, wherein
the substrate with the insulating layer is cooled when the second insulating layer is formed.

9. The method for fabricating a nanodevice according to claim 7, wherein
the second insulating layer is formed using any one of methods: catalytic CVD, plasma CVD, photo CVD, pulsed laser deposition, atomic layer epitaxy, and thermal CVD.

10. An integrated circuit, comprising:
a first insulating layer provided above a semiconductor substrate on which an electric device is formed;
one and the other electrodes provided to have a nanogap on the first insulating layer;
a metal nanoparticle or a functional molecule provided between the one and the other electrodes;
a second insulating layer provided on the first insulating layer, and on the one and the other electrodes to embed the metal nanoparticle or the functional molecule;
one or more side gate electrodes provided on the first insulating layer in a direction crossing a direction in which the one and the other electrodes are provided, the side gate electrode(s) covered with the second insulating layer; and
a top gate electrode provided on the second insulating layer;
wherein one of electrodes of the electronic device is connected to the one electrode or the other electrode with a via provided through the first insulating layer;
wherein a monolayer as a part of the second insulating layer is interposed between the metal nanoparticle and the one electrode and between the metal nanoparticle and the other electrode, or
wherein the functional molecule comprises an anchor part to be fixed on the one and the other electrodes.

* * * * *